(12) United States Patent
Bachmann et al.

(10) Patent No.: US 8,008,161 B2
(45) Date of Patent: Aug. 30, 2011

(54) CAPACITOR ASSEMBLIES

(75) Inventors: Jens Bachmann, Dresden (DE); Bernd Föste, Dresden (DE); Klaus Goller, Dresden (DE); Jakob Kriz, Weinböhla (DE)

(73) Assignee: Infineon Technologies AG, Neubiberg (DE)

( * ) Notice: Subject to any disclaimer, the term of this patent is extended or adjusted under 35 U.S.C. 154(b) by 1117 days.

(21) Appl. No.: 11/156,908

(22) Filed: Jun. 20, 2005

(65) Prior Publication Data

US 2005/0287755 A1 Dec. 29, 2005

Related U.S. Application Data

(63) Continuation of application No. PCT/DE03/03933, filed on Nov. 27, 2003.

(30) Foreign Application Priority Data

Dec. 20, 2002 (DE) .................................. 102 60 352

(51) Int. Cl.
*H01L 21/20* (2006.01)

(52) U.S. Cl. ... 438/396; 438/381; 438/387; 257/E21.01; 257/E21.004; 257/E21.008; 257/E21.009; 257/E21.021; 257/E21.257; 257/E21.577; 257/E21.579

(58) Field of Classification Search .................. 438/381, 438/250, 253, 387, 396; 361/301.4, 303, 361/306.1, 306.3, 307, 308.1, 308.2, 308.3, 361/312, 313, 321.3, 322, 328–330; 29/25.42; 257/E21.01, 4, 8, 9, 21, 257, 577, 579

See application file for complete search history.

(56) References Cited

U.S. PATENT DOCUMENTS

| | | | | |
|---|---|---|---|---|
| 4,700,457 A | * | 10/1987 | Matsukawa | 438/396 |
| 5,679,213 A | * | 10/1997 | Noshiro | 438/669 |
| 5,745,335 A | * | 4/1998 | Watt | 361/313 |
| 6,103,633 A | | 8/2000 | Shen et al. | |
| 6,123,088 A | | 9/2000 | Ho | |
| 6,198,617 B1 | | 3/2001 | Sun | |
| 6,281,023 B2 | * | 8/2001 | Eastep et al. | 438/3 |
| 6,437,385 B1 | | 8/2002 | Bertin et al. | |
| 6,452,779 B1 | | 9/2002 | Adler et al. | |
| 6,479,376 B1 | * | 11/2002 | Huang et al. | 438/613 |

(Continued)

FOREIGN PATENT DOCUMENTS

EP 1 251 559 A2 10/2002

(Continued)

OTHER PUBLICATIONS

M.M. Watt et al., "Feasibility Demonstration of a Multi-level Thin Film BST Capacitor Technology," Proceedings of the Eleventh IEEE International Symposium on Montreux, Aug. 1998, 4 pages.

(Continued)

*Primary Examiner* — Thao X Le
*Assistant Examiner* — Eric W Jones

(57) ABSTRACT

A method for fabricating a capacitor arrangement which includes at least three electrodes is described. The capacitor arrangement is fabricated using a number of lithography methods that is smaller than the number of electrodes. A capacitor arrangement extending over more than two or more interlayers between metallization layers has a high capacitance per unit area and can be fabricated in a simple way is also described. The circuit arrangement has a high capacitance per unit area and can be fabricated in a simple way. An electrode layer is first patterned using a dry-etching process and residues of the electrode layer are removed using a wet-chemical process, making it possible to fabricate capacitors with excellent electrical properties.

20 Claims, 13 Drawing Sheets

U.S. PATENT DOCUMENTS

| | | | |
|---|---|---|---|
| 6,703,319 B1 * | 3/2004 | Yates et al. | 438/745 |
| 6,838,717 B1 * | 1/2005 | Yen et al. | 257/295 |
| 6,919,244 B1 * | 7/2005 | Remmel et al. | 438/239 |
| 7,294,544 B1 * | 11/2007 | Ho et al. | 438/250 |
| 2001/0017285 A1 | 8/2001 | Kato et al. | |
| 2002/0006674 A1 | 1/2002 | Ma et al. | |
| 2002/0127746 A1 * | 9/2002 | Chuang et al. | 438/14 |
| 2002/0160542 A1 | 10/2002 | Kim et al. | |
| 2002/0185683 A1 * | 12/2002 | Yamazaki et al. | 257/347 |
| 2002/0192919 A1 | 12/2002 | Bothra | |
| 2003/0068899 A1 * | 4/2003 | Bachmann et al. | 438/720 |
| 2003/0166345 A1 * | 9/2003 | Chang | 438/717 |
| 2004/0104420 A1 * | 6/2004 | Coolbaugh et al. | 257/310 |
| 2004/0209457 A1 * | 10/2004 | Hirano et al. | 438/634 |
| 2005/0017328 A1 * | 1/2005 | Bachmann et al. | 257/629 |

FOREIGN PATENT DOCUMENTS

| | | |
|---|---|---|
| JP | 01-120858 | 5/1989 |
| JP | 01-278060 | 11/1989 |
| JP | 07-130702 | 5/1995 |
| JP | 2000174212 A | 6/2000 |
| JP | 2000-514243 | 10/2000 |
| JP | 2001-230382 | 2/2003 |
| WO | WO 98/00871 | 1/1998 |
| WO | WO 01/78093 A2 | 10/2001 |

OTHER PUBLICATIONS

English Translation of Japanese Office Action Dated Jun. 1, 2009.
European Office Action and English Translation for Serial No. 08 160 938.0—1235, Dated Jul. 8, 2010.

* cited by examiner

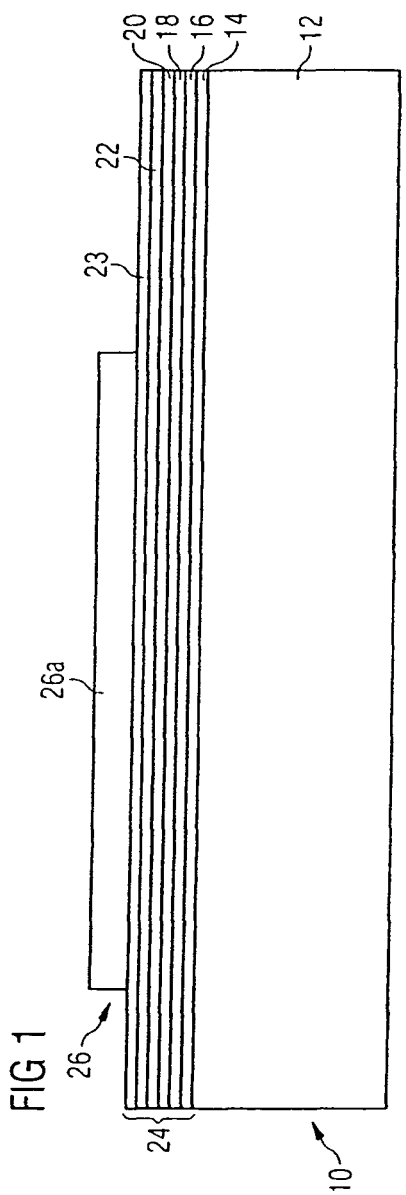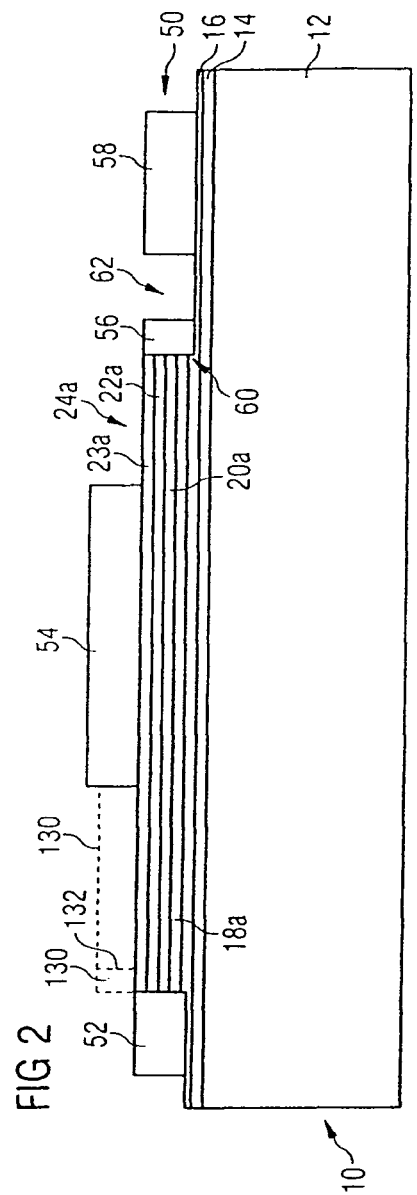

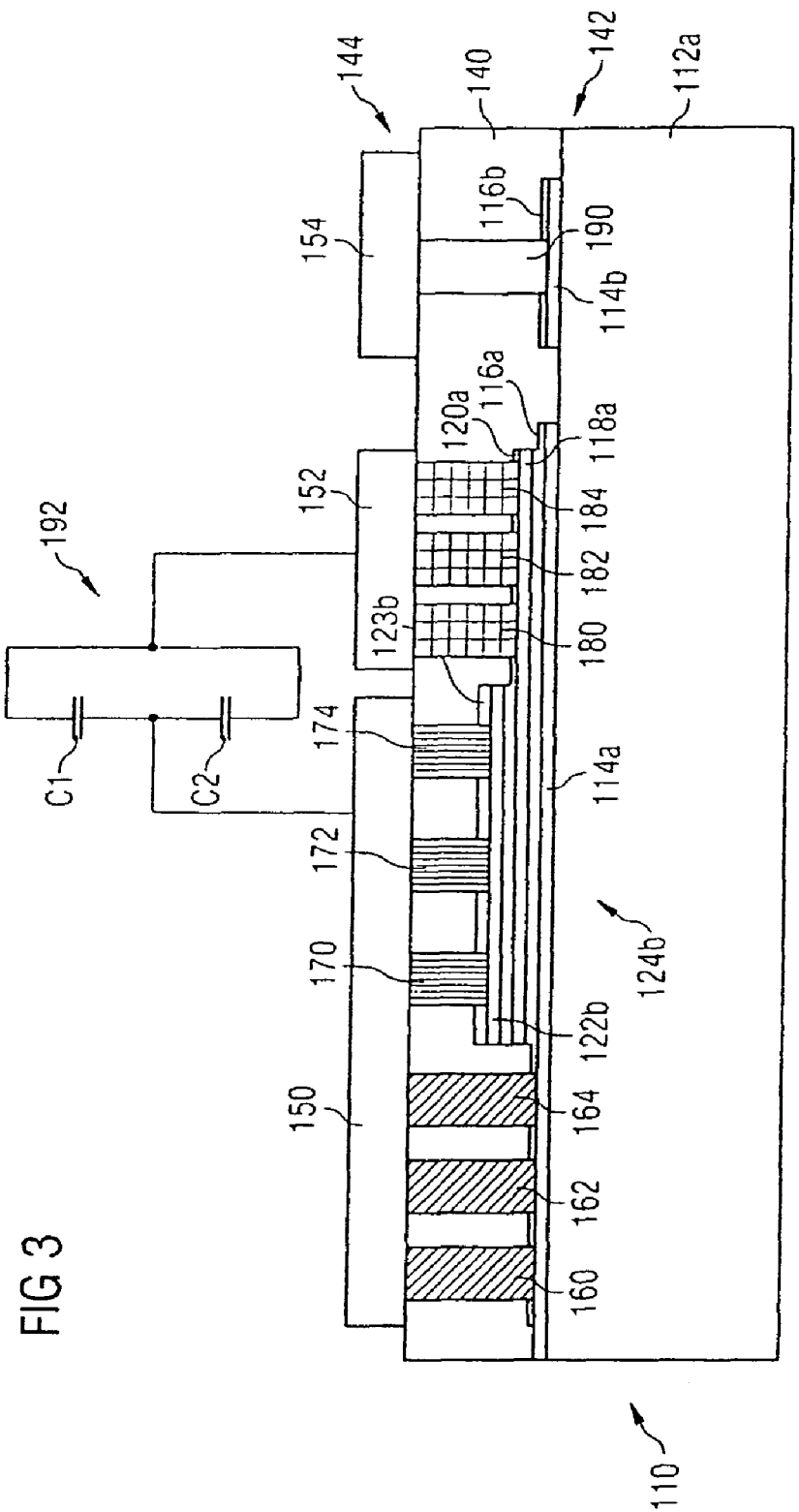

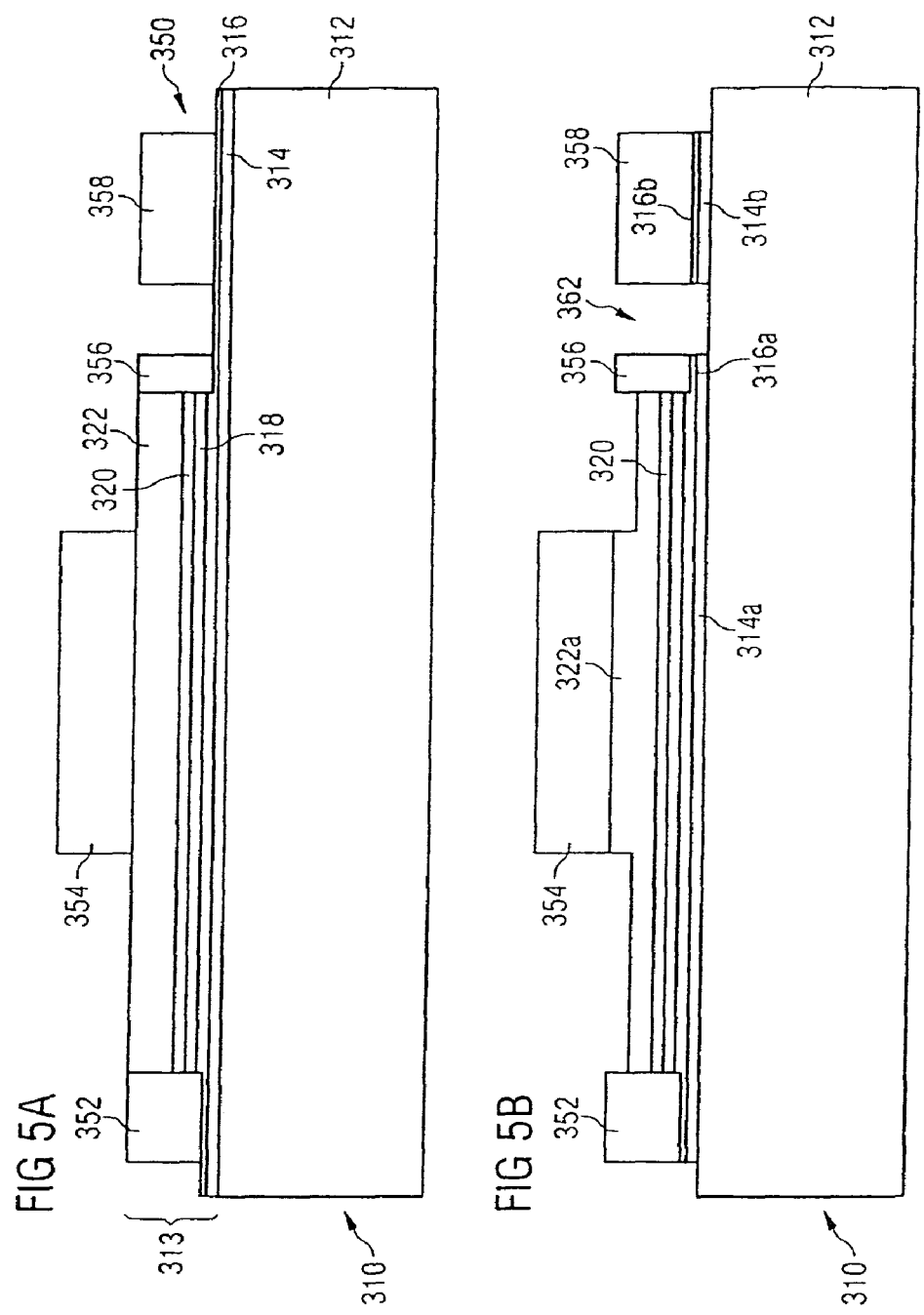

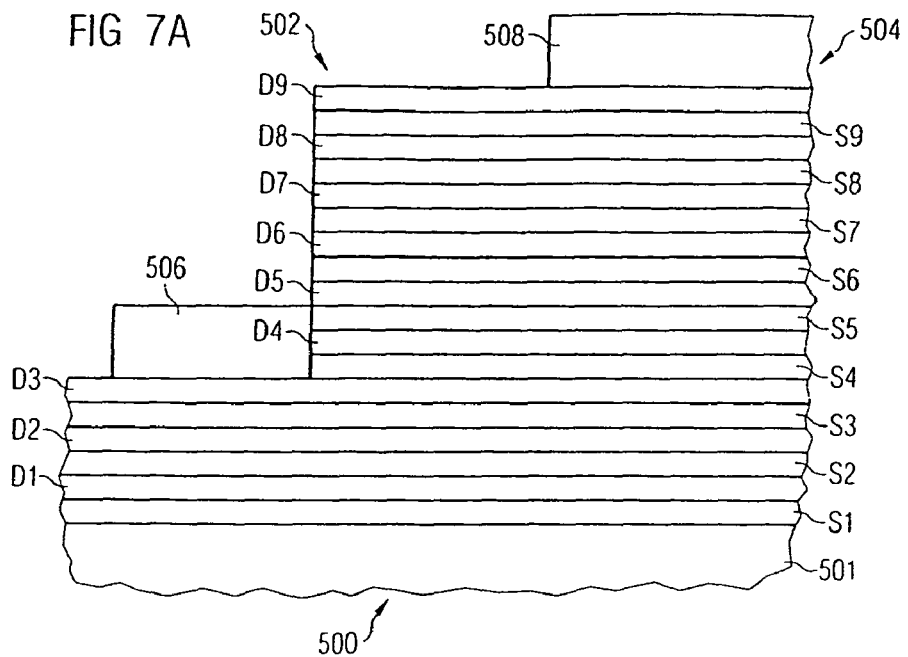
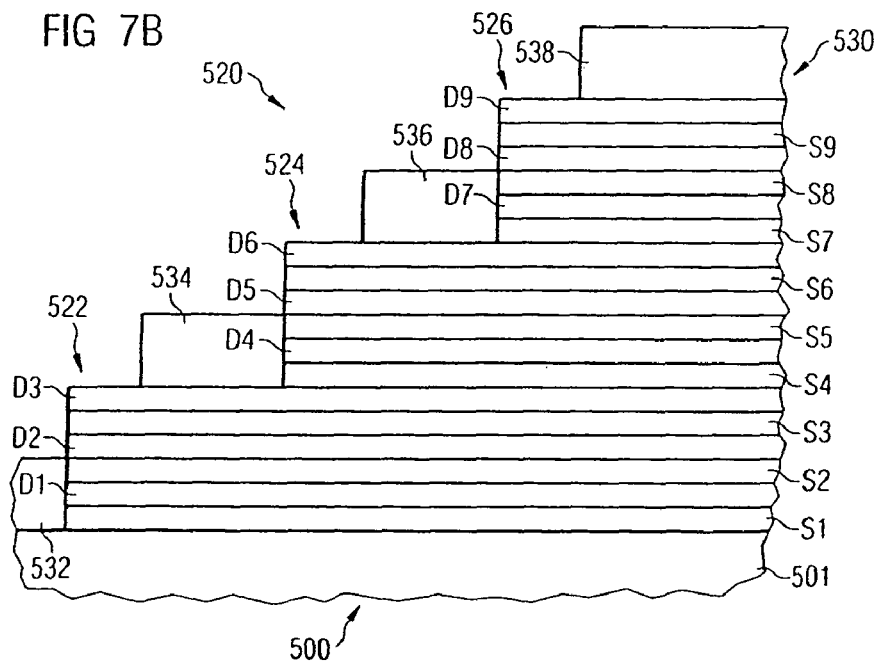

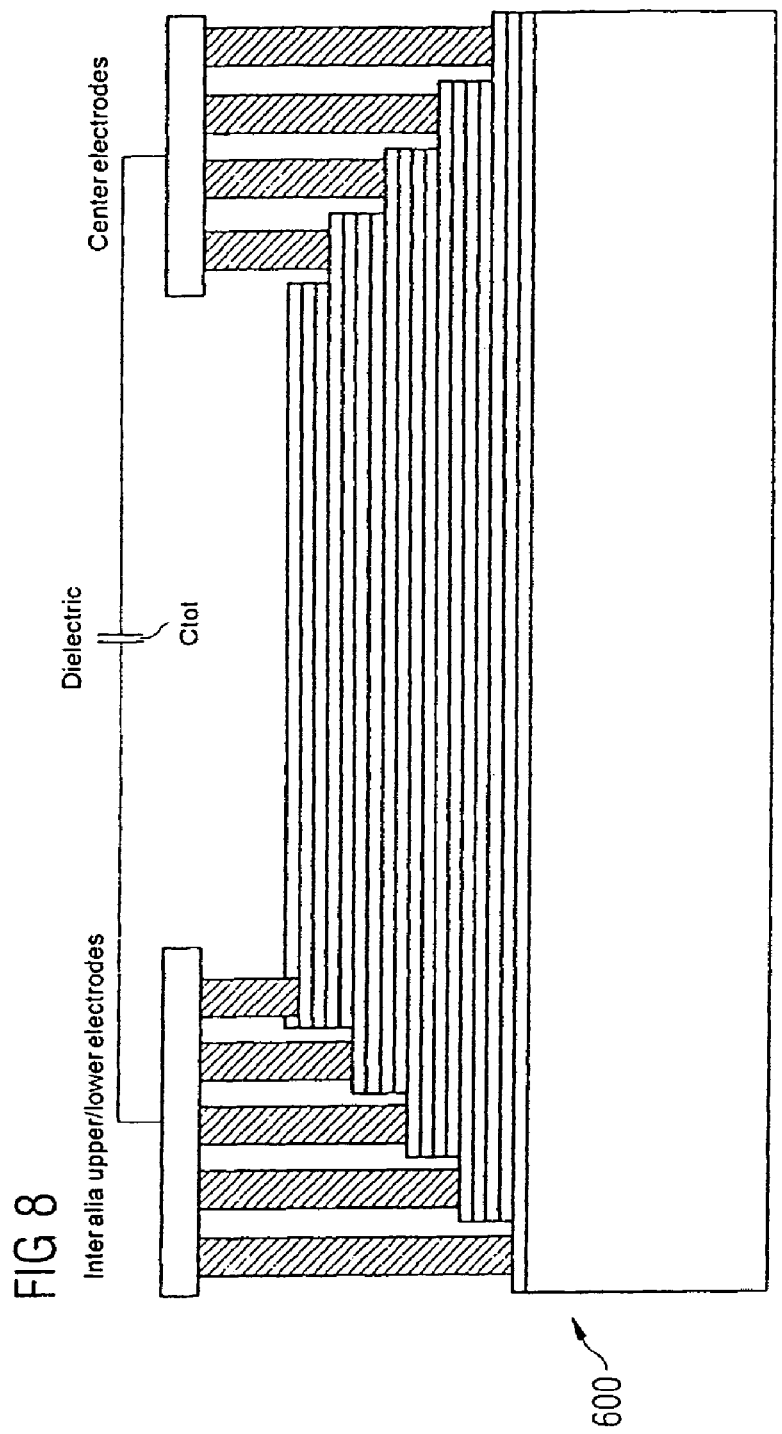

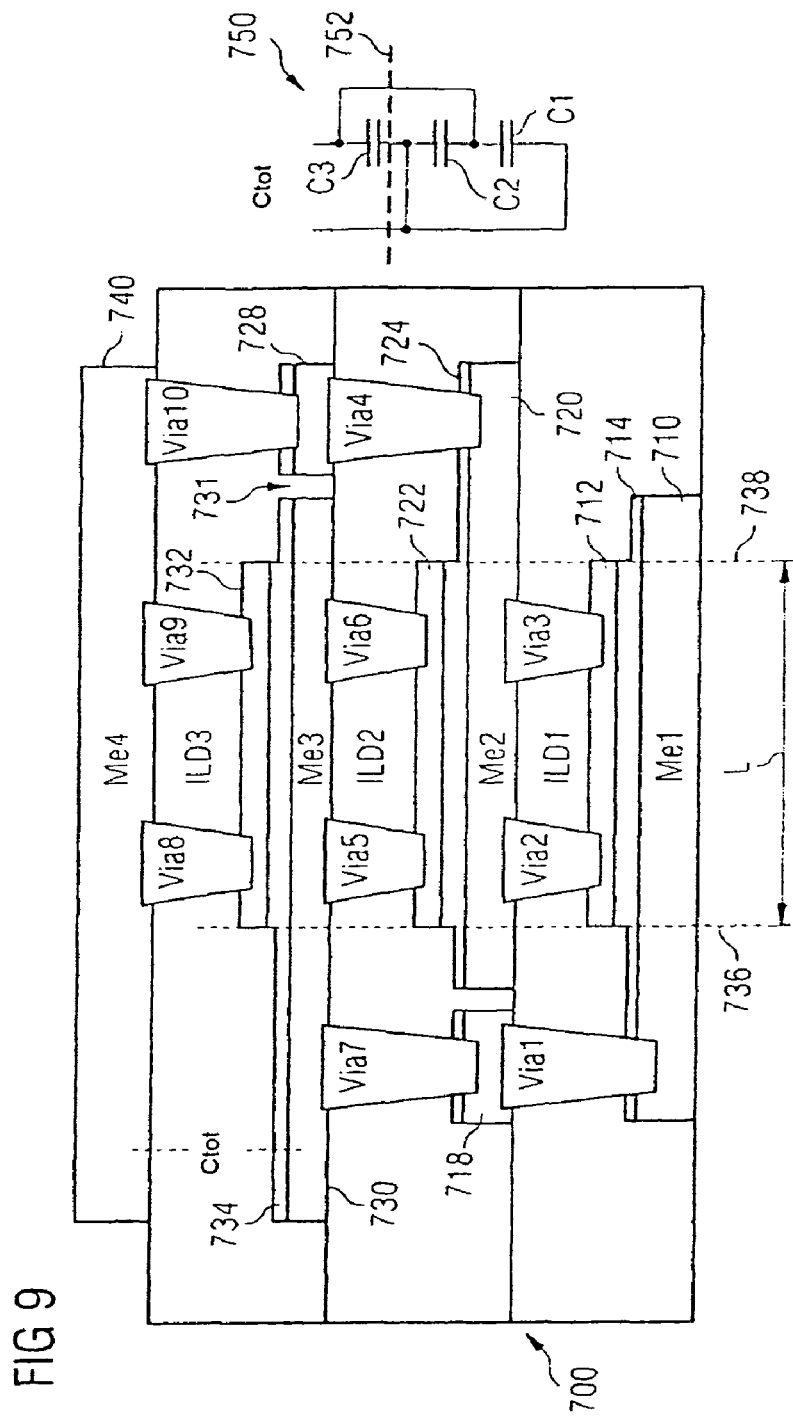

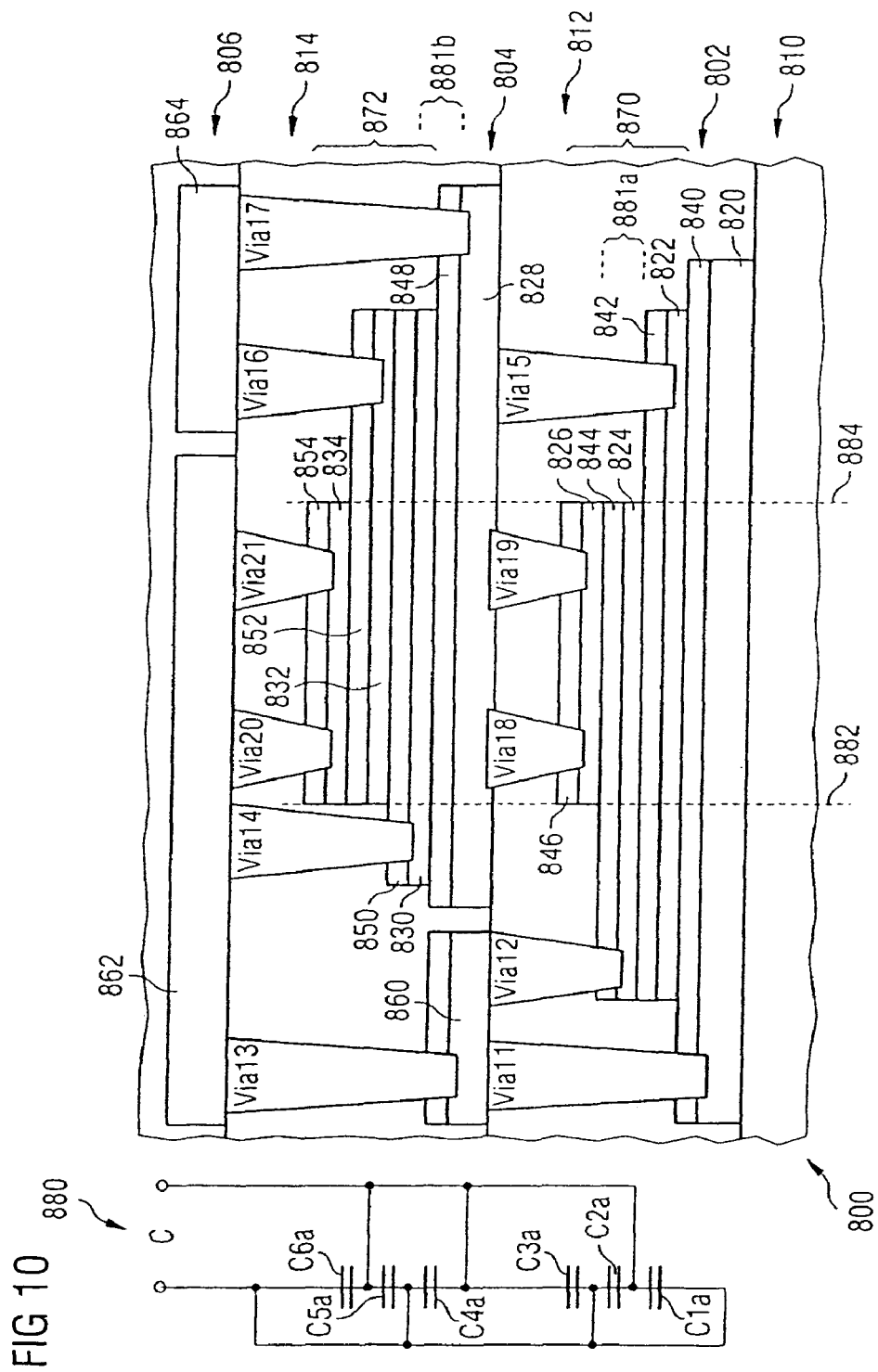

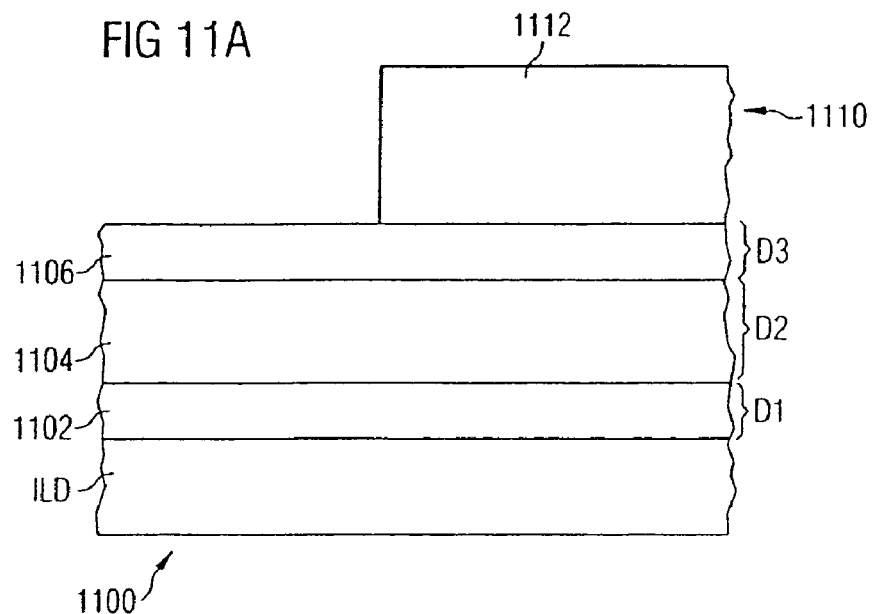
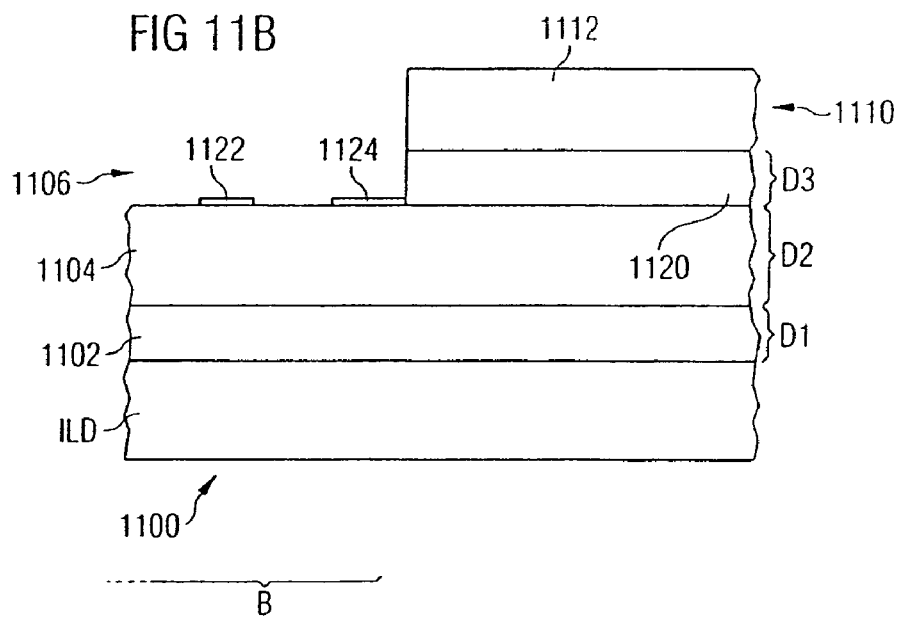

CAPACITOR ASSEMBLIES

PRIORITY AND CROSS REFERENCE TO RELATED APPLICATION

This application is a continuation of International Application No. PCT/DE03/03933 filed Nov. 27, 2003, which claims priority to German application 102 60 352.9 filed Dec. 20, 2002, both of which are incorporated herein in their entirety by reference.

BACKGROUND

1. Field of the Invention

The present invention relates to the field of the integrated capacitor assemblies and fabrication thereof. In particular, the present invention relates to a capacitor arrangement having a layer stack.

2. Description of the Related Art

Integrated circuit arrangements having capacitors, known as MIM (metal insulator metal) capacitors, may be used in integrated circuit arrangements. Electrode layers, or the electrodes, in these capacitors are not necessarily produced from a metal or a metal alloy. For example, there are electrodes made from doped polysilicon. The electrodes usually have a resistivity of less than 10-3 Ωcm. A dielectric, which usually has an electrical resistivity of greater than 10-12 Ωcm, is arranged between the electrodes.

For many applications, there may be a demand relating to the linearity and quality of the capacitors in the integrated circuits. Also, the integrated capacitor should be as simple as possible to fabricate and the capacitance per unit of chip area should be as high as possible.

SUMMARY OF THE INVENTION

By way of introduction only, a capacitor assembly and method for the fabricating capacitor assemblies are described. The present invention provides a capacitor arrangement and simple method for fabricating a capacitor arrangement, which makes it possible in particular to fabricate capacitor arrangements having a high quality and a high linearity and/or a high capacitance per unit area.

The present invention is based, at least in part, on the consideration of technological development to provide the highest possible capacitance per unit area. This may be achieved, for example, by selecting dielectrics whose dielectric constant is as high as possible. A minimum permissible thickness, and therefore, also the maximum capacitance per unit area are determined by the product requirements relating to service life and dielectric strength. By way of example, with a thickness of approximately 45 nm of silicon nitride SiN, a capacitance of approx. 1.30 fF/μm2 (Femtofarad per square micrometer) may be achieved with a service life of 15 years, 2.3 mm 2 total surface area in the product and an operating voltage of 3.6 V. A further reduction in the thickness may lead to product failures within the 15 years on which the product is based. Higher overall capacitances lead to further demands for area in the product, and therefore, to higher chip costs.

The invention is also based, at least in part, on the consideration that the outlay involved in patterning each individual electrode is a factor that may limit the number of electrodes arranged between two metallization layers from being increased. This outlay increases linearly in relation to the number of electrodes unless additional measures are taken. Therefore, in a method according to one embodiment of the invention, at least one center electrode layer and a covering dielectric layer are arranged between the base dielectric layer and the covering electrode layer. The covering electrode layer and the center electrode layer are patterned using a first lithography method, and then, the pre patterned covering electrode layer and the base electrode layer are patterned using a second lithography method. Therefore, a method according to the invention may use just two lithography methods for three electrodes. The linear relationship between the number of electrodes and the number of lithography methods used to pattern the capacitor arrangement is broken. As a result, the number of lithography and etching steps involved in the process is considerably reduced. The more electrodes are stacked on top of one another for a capacitor arrangement, the more manifest this effect becomes.

An idea of the method according to the invention is first to produce a layer stack having electrode layers for the electrodes required. Then, an upper part of the layer stack, for example, the two upper electrode layers or an upper layer stack comprising more than two electrode layers, is patterned in the first lithography method. Next, both electrode layers in the upper layer stack i.e., electrode layers which have already been patterned with the aid of the first lithography method, and electrode layers which have not yet been patterned with the aid of the first lithography methods; are patterned simultaneously in the second lithography method.

In a refinement, a stack having at least two center electrode layers is produced between the base dielectric layer and the covering electrode layer. After a center electrode layer has been produced and before the next center electrode layer is produced, in each case a center dielectric layer located between two adjacent center electrode layers is produced. In a simple case of this refinement, therefore, the capacitor arrangement includes at least four electrodes. Each center electrode is used for capacitances above and below the center electrode. By way of example, if five electrodes are used, the capacitance of the arrangement is doubled compared to an arrangement with three electrodes, which in turn has double the capacitance or capacitance per unit area of an arrangement with two electrodes. By way of example, only three lithography methods are required to fabricate a capacitor arrangement with five electrodes.

In a another refinement, during the first lithography method, at least one electrode layer arranged between the covering electrode layer and the center electrode layer is patterned together with the covering electrode layer. Moreover, during the first lithography method at least one electrode layer arranged between the center electrode layer and the base electrode layer, for example an electrode layer which adjoins the center electrode layer, is patterned together with the center electrode layer. However, the base electrode layer itself is not patterned during the first lithography method. During the second lithography method the covering electrode layer and the electrode layer arranged between the covering electrode layer and the center electrode layer are patterned. The base electrode layer and at least one electrode layer arranged between the base electrode layer and the center electrode are likewise patterned during the second lithography method. In this case, the electrode layer patterned apart from the base electrode layer was likewise not patterned in the first lithography method. In this refinement, the capacitor arrangement includes at least six electrodes. Only three lithography methods are required to pattern six electrodes, each with different electrode forms than the other electrodes. However, the same method can also be used to produce a capacitor arrangement which includes still more electrodes, for example nine electrodes. In the case of nine electrodes, only four lithography methods are required for the individual patterning of each electrode.

In another refinement, a third lithography method, in which at least two non-adjacent electrode layers of the layer stack are patterned, is carried out at least once after the first two lithography methods. However, the electrode layers lying between the electrode layers that are patterned in the third lithography method are not patterned in the third lithography method. It possible to further refine stepped arrangements which have been produced using the first two lithography methods.

In another refinement, when the lithography methods are performed, the etch is stopped on at least one dielectric layer that is located beneath the electrode layer etched last in this lithography method. In one configuration, the entire etch is carried out by dry-chemical or chemical physical means, e.g. using a plasma process or an RIE (Reactive Ion Etching) process. This measure ensures that the dielectric is not damaged in the region of the electrode edge. Damage to the dielectric in particular in the electrode edge region leads to considerable restrictions in terms of the linearity and quality of the capacitor arrangement. By way of example, voltage sparkovers are possible at these regions. Alternatively, when a lithography method is being carried out the etch is stopped in the electrode etched last in this lithography method. The remaining part of this electrode is etched by wet-chemical means. The dielectric is not attacked as strongly during the wet chemical etching as during the dry chemical etching.

In a another refinement, regions of dielectric layers that have been partially etched or serve as an etching stop in the vicinity of an electrode patterned last in a lithography method are covered with a resist in the next, and also the following lithography method, so that damage to the dielectric may be prevented in these regions. Electrode layer edge regions which lie in the vicinity of a dielectric that has been etched through in a lithography method are removed in a subsequent lithography method. Consequently, the damaged dielectric no longer has any electrical functions for the capacitor arrangement.

In another refinement, the layer stack of the capacitor arrangement is free of electrode edges that are flush in the stacking direction, i.e. in the direction perpendicular to the wafer surface. The result of this measure is that there are no dielectric layers which have been etched all the way through at the outer edges of the electrodes.

In another refinement, the electrode connections of every second electrode are arranged on one side of the stack. By contrast, the electrode connections of the other electrodes are arranged on another side of the stack. This provides very simple wiring of the capacitor arrangement in a metallization plane without excessively branched interconnect structures.

In another refinement, the electrodes of the layer stack are fabricated with a substantially identical layer thickness, leading to a low height of the layer stack compared to layers with different thicknesses within a layer stack. Alternatively, an electrode which is patterned earlier than another electrode is designed to be thicker than the other electrode. The thicker electrode is preferably the covering electrode. The use of electrodes of different thickness makes it possible to increase the process windows in the patterning of the layer stack.

In another refinement, electrode connections are lined up on at least one side, on at least two sides, on at least three sides or on at least four sides of an electrode, making it possible to reduce connection resistances, leading to a high quality of the capacitor arrangement.

In another refinement, an electrode layer is patterned into a plurality of partial electrodes, preferably the covering electrode layer. The partial electrodes are connected in such a way that they can be connected to one another to increase the capacitance of the capacitor arrangement. Modeling capacitances of this type may be used, for example, in dual band or triple band mobile communications circuits. The invention also relates to a capacitor arrangement, that includes, in the following order:

abase electrode,
abase dielectric,
at least two center electrodes,
a covering dielectric, and
a covering electrode.

The capacitor may include three center electrodes, five center electrodes or seven center electrodes, etc. The capacitor arrangement can be utilized to adapt the target capacitance in radio frequency products. By way of example, they are used for GSM (Global System for Mobile Communication) or in UMTS applications (Universal Mobile Telecommunication System), in particular in mobile telephones, but also in WLANs (Wireless Local Area Networks). By way of example, an additional capacitance that is present in the capacitor arrangement is connected to a main capacitance that is present in the capacitor arrangement, or is separated from the main capacitance in circuitry terms.

The chip size can be considerably reduced on the basis of the capacitor arrangement according to the invention. Typical values for the proportion of the area formed by capacitor arrangements in a radiofrequency product were previously, by way of example, 50%. These areas and their immediate surroundings in the chip are not suitable for active components on account of the feedback and injection. Consequently, any reduction in the surface area brought about by the capacitor arrangement according to the invention leads to savings on chip area.

An exemplary capacitor arrangement according to the invention may located either between two metallization layers that include interconnects used to connect the capacitor arrangements or to connect electronic components. The capacitor arrangement may also be arranged between more than two metallization layers, in particular precisely above one another and with electrically conductive connections to one another.

According to a second aspect, the invention relates to an integrated circuit arrangement which, by way of example, includes a semiconductor substrate that includes a multiplicity of active regions of electronic components. The semiconductor substrate is, for example, a silicon chip. The active regions are, for example, channel regions of field effect transistors or active regions of bipolar transistors.

On account of the large number of electronic components, at least three metallization layers that are separated from one another by insulating interlayers are included in the integrated circuit arrangement. A metallization layer usually extends in a plane and may include interconnects that are used to connect the electronic components. The integrated circuit arrangement may include electrically conductive contact sections that are positioned transversely, i.e. in the perpendicular direction to a semiconductor substrate, to the metallization layers, also known as vias.

The specialist article "High performance, low complexity 0.18 um SiGe BiCMOS Technology for Wireless Circuit Applications", N. Feilchenfeld et al., IEEE BCTM 11.3, page 197 to page 200, discusses dual MIM (metal insulator metal) capacitors, which double the capacitance per unit area. The known MIM capacitor with three electrodes is located between two metallization layers.

The present invention may provide a circuit arrangement of simple structure with a capacitor arrangement having a high capacitance per unit area, a high quality and a high linearity. Moreover, it is intended to provide capacitor arrangements which include at least one capacitor arrangement according to the invention. The second aspect of the invention is based, at least in part, on the considerations that the increase in the capacitance per unit area which can be achieved solely by using dielectrics with high dielectric constants and minimal layer thicknesses has reached a limit. Moreover, the second aspect of the invention may be based on the consideration that even when MIM capacitors with more than two electrodes between two metallization layers are used, a limit on the number of electrodes is quickly reached. For example, the distance between different metallization layers is 1 nm. Therefore, an exemplary circuit arrangement may include a capacitor arrangement that includes electrodes that have been connected via contact sections to form two intermeshing capacitor plates. The electrodes of the capacitor arrangement are arranged in at least two interlayers. The capacitor arrangement may extend over a plurality of interlayers or also over a plurality of metallization layers.

The capacitance per unit area achieved when using the measures can be increased up to five fold compared to a single MIM capacitor if, for example, five interlayers are included, even if there is only one electrode per interlayer. If three or even more electrodes are arranged in an interlayer, the capacitance per unit area increases ten fold when, for example, five interlayers are incorporated. An increase in the capacitance per unit area reduces the chip area required for a capacitor arrangement of predetermined capacitance. Moreover, the capacitor arrangement may offer the option of producing at least one electrode per interlayer using the same layout. This reduces the additional costs involved in developing masks.

The circuit arrangement may have each electrode electrically connected in a simple way, and with little chip area required with a high density of contact holes, leading to a high quality of capacitance. Furthermore, the extent to which the capacitance is dependent on the voltage or the polarity of the electrodes is reduced. This is an advantage for radio frequency products, for example, for mobile communications applications or wireless local area networks.

In a refinement, at least one electrode or a partial electrode of the capacitor arrangement lies in a metallization layer to increase the number of electrodes lying above one another in the capacitor arrangement in a simple way. In one configuration, at least one electrode of the capacitor arrangement includes a partial electrode lying in a metallization plane and a partial electrode lying between two metallization planes. The two partial electrodes are electrically conductively connected to one another via at least one contact section, but preferably via a plurality of contact sections. The electrode having partial electrodes bridges spaces that are not required for the capacitor arrangement in the interlayers, simplifying fabrication of the capacitor arrangements that include, in an interlayer, an electrode stack whose height is lower than the height of the interlayer.

In another refinement, electrodes of the capacitor arrangement are arranged in at least three interlayers or in more than three interlayers. The more interlayers are incorporated in the capacitor arrangement, the higher the capacitance per unit area becomes and the more often mask layouts or parts of mask layouts can be reused.

In another refinement, at least one electrode arranged in an interlayer has the same contour as another electrode arranged in another interlayer. These measures allow partial layouts of masks for this electrode to be reused in the fabrication of a circuit arrangement.

In another refinement, the electrodes having the same contour are arranged precisely above one another, i.e. they are flush along their entire edge in the direction perpendicular to a substrate surface which supports the capacitor arrangement, e.g. a semiconductor substrate. When partial layout data of the masks are transferred, this measure makes it possible to maintain not only the contours but also the position within a plane.

In another refinement, at least two electrodes or at least three electrodes are arranged between two metallization layers (the term electrode also may refer to a partial electrode).

In another refinement, there are at least three successive electrodes in the capacitor arrangement that have been patterned using a number of lithography methods that is less than the number of successive electrodes. By way of example, three electrodes can be patterned with just two lithography methods if the two upper electrodes are patterned in a first lithography method and the top and bottom electrodes are patterned in the second lithography method. This measure further reduces the outlay on masks, since fewer masks are required and these masks can if appropriate also be used in a plurality of interlayers.

In another refinement, each electrode is connected by a plurality of contact sections, reducing the contact resistance and increasing the quality of the capacitor and its linearity. In one configuration, the contact surface of at least one partial electrode lying in an interlayer forms more than 300 (percent) or more than 50% of the basic surface area of this partial electrode. The partial electrodes can be connected in the capacitor arrangement with a very large contact surface without the need for additional chip area.

In a further refinement, the contact surface for connection of at least one further electrode, which is not a partial electrode, is equal in size to the contact surface for connection of the partial electrode. All the electrodes of the capacitor arrangement may be connected via substantially identical contact surfaces, increasing the linearity and reducing the dependency on voltage or polarity, so that the capacitor arrangement is suitable for radiofrequency applications, i.e. for applications with charge reversal operations on the capacitor arrangement in the upper kilohertz range or even in the megahertz range.

In another refinement, the metallic sections of the metallization layers are made from copper, aluminum, a copper alloy or an aluminum alloy. The metallization layers have a thickness of greater than 100 nm or greater than 150 nm. By way of example, metallization layers with a thickness of 500 nm are used. The metallic sections of the metallization layers, in particular the electrodes or partial electrodes, can be contacted on two surfaces, i.e. from above and below. By contrast, electrodes in interlayers are contacted only on their upper electrode surface. In one configuration, a metal or a metal alloy is used as material for the electrodes in interlayers. In particular when metal nitrides, e.g. titanium nitride, tantalum nitride or tungsten nitride, are used, the electrodes in interlayers can be made very thin. The electrodes in interlayers may be thinner than 100 nm or even thinner than 60 rim, for example 45 nm. The use of such thin electrode layers makes it possible to keep the height of the capacitor arrangement low, even if more than one electrode is formed per interlayer. In another configuration, the dielectric between the electrodes is an oxide, in particular silicon dioxide. However, as alternative nitrides, for example silicon nitride, are also used. Double layers or multiple layers made from dielectric materials are also employed.

The invention also relates to a set of at least two capacitor arrangements. The capacitor arrangements, apart from geometric designs for defining the position of the contact sections, have been produced in accordance with the same geometric designs. For example, in particular the electrodes in interlayers are substantially identical in both capacitor arrangements. At least one of the capacitor arrangements is constructed in the same way as a capacitor arrangement according to the invention or one of its refinements. Moreover, at least one contact section for connection of an electrode is present in one capacitor arrangement and is not present, i.e. is absent, in the other capacitor arrangement, so that at least one electrode in the other capacitor arrangement is not connected. The result of this measure is that capacitor arrangements of different capacitances can be produced in a simple way by introducing or omitting a contact section or a plurality of contact sections while otherwise using the same fabrication process. In one refinement, the connected electrode is in the same position with respect to the one capacitor arrangement as the unconnected electrode with respect to the other capacitor arrangement.

According to a third aspect, the invention relates to a method comprising the steps of:
producing a dielectric layer,
producing an electrode layer on the dielectric layer, and
patterning the electrode layer using a chemical or a chemical physical dry etching process. The invention provides a simple method for fabricating an integrated capacitor arrangement, making it possible to fabricate capacitor arrangements of high quality, high linearity, with low capacitance tolerances and with a long service life. In particular, it is also possible for an integrated circuit arrangement which includes the capacitor arrangement to be produced with a high yield.

The invention is based, at least in part, on the fact that service life tests carried out on metal insulator metal capacitors, i.e. what are known as MIMCAPs, show that the quality of the capacitor is directly influenced by the patterning of the metal electrodes, in particular in the case of plasma etching. Although an optimally matched plasma etching process would lead to considerably increased service lives of the capacitor arrangement, this would be to the detriment of a sufficient process window for the etching process. This is because a decrease in the metal etch which damages the dielectric, with its corresponding increase in the quality of the dielectric, also increases the risk of product failures, in particular resulting from short circuits induced by residues of the metal of the electrode. In other words, the lower the level of overetching, the greater the service life of the capacitor arrangement. On the other hand, it is also the case that real semiconductor wafers are not ideally planar, but rather include topology induced unevenness. Moreover, the thickness of the electrode layer fluctuates, so that a "theoretical" etching time, which is calculated from the thickness of the electrode layer divided by the etching rate, would lead to metal residues on the dielectric. The consequence is short circuits, for example between adjacent capacitor arrangement or with vias. Masking effects also occur during the subsequent patterning of the electrode and residues that are located at the electrode edges have already been pre patterned by the dry etching process and project beyond the pre patterned edge are highly disruptive, in particular with regard to the manufacturing tolerances which can be achieved for the capacitance of the capacitor.

The invention is also based, at least in part, on the consideration that "targeted" etches with a perpendicular preferential direction, i.e. with a preferential direction in the direction normal to a semiconductor substrate surface with active regions, are used to pattern the metallic electrodes. However, any etch has an isotropic component, in this case a. lateral component. In addition to the perpendicularly directed patterning of the electrode, a lateral etching attack will also occur at the boundary layer between dielectric and electrode. In operation, voltage peaks are formed at these locations, leading to premature product failure. However, the lateral component of a dry etch is low in relation to the lateral component of an anisotropic wet etch. Therefore, the electrode layer may be patterned using a strongly isotropic dry etching method which ensures a high dimensional stability until only slight residues remain on the dielectric layer. Then, these residues are removed by wet-chemical means, for example in a wet-chemical etching process or in a cleaning step.

The result of this measure is that the dielectric is not etched or is only partially etched to a negligible degree with regard to the effects on the electrical properties of the capacitor arrangement during the patterning of the electrode layer, in particular during the dry etching. The fact that residues are left in place during the dry etching and that the residues are subsequently removed by wet chemical means ensures that production can be carried out with a high yield despite the long service life which is achieved. The wet-chemical step can be very short, for example may last less than 30 seconds, on account of the low thicknesses of the residues. Consequently, the anisotropy of the wet-chemical process is acceptable.

Alternatively, a thin continuous layer of the electrode layer, without holes, remains in the regions attacked during the dry etching, and those regions of the electrode layer which have already been thinned during the dry-etching process are removed by wet chemical means. In this case, the dielectric is not damaged by the dry-etching process. By way of example, the electrode layer is thinned to a thickness of only 2 nm (nanometers) or 3 nm prior to the wet etching.

In a refinement, the wet chemical removal of the residues is carried out selectively with respect to the material of the dielectric layer, preferably with a selectivity of greater than 4:1 or even greater than 10:1, resulting in the dielectric that is not damaged during the removal of the residues and preventing damage to the dielectric in the vicinity of the sensitive electrode edge. Wet etches have a very high selectivity compared to dry etches, in particular compared to chemical-physical dry etches. For example, selectivities of at least 100:1 or 150:1 are possible in the case of wet etches or wet-cleaning steps.

In another refinement of the method according to the invention, the electrode layer is etched with time control. Therefore, end point detection, which would require significant partial etching of the dielectric, is not used. In particular in the case of very thin electrode layers, for example in the case of electrode layers with a thickness which does not exceed 100 nm or 60 nm, the etching time can easily be calculated on the basis of the linear relationships which then still apply, for example by the layer thickness, which can be set very accurately by process engineering means, being divided by the etching rate. The etching rate has previously been determined, for example empirically. In the case of the abovementioned second alternative, the etching time which is calculated in this way is shortened by a few seconds in order to only thin the electrode layer. The electrode layer includes, for example, of a metal nitride, such as titanium nitride, tungsten nitride or tantalum nitride. These materials have a sufficiently good conductivity and can be deposited in very small layer thicknesses with an acceptable level of outlay.

In another refinement, the electrode layer consists of titanium nitride, which titanium nitride may be dry-etched using nitrogen trifluoride NF3 or using sulfur hexafluoride SF6. In a refinement, an aqueous basic solution which contains, for example, hydrogen peroxide $H_2O_2$, ammonia $NH_3$ and water $H_2O$ is used for the wet cleaning or the wet etching. Hydrogen peroxide $H_2O_2$ serves as an oxidizing agent which dissolves $TiO_2$ which is formed. Alternatively, an acid, in particular a solution of nitric acid $HNO_3$ and hydrofluoric acid HF, is also used for the wet cleaning. The dielectric layer may include silicon nitride or silicon dioxide. However, other suitable dielectrics, e.g. dielectrics whose relative dielectric constants are greater than 8, are also used. A high capacitance per unit area can only be achieved with very thin dielectrics, but the thickness must not drop below a minimum thickness, in order to achieve a high production yield.

In another refinement, the dielectric layer is patterned using a chemical or chemical-physical etching method, after the wet-chemical removal. Alternatively or in addition, the dielectric layer is patterned at a distance from the electrode, in particular at a distance which is greater than 5 nm or greater than 50 nm or greater than 100 nm, so that damage to the high quality dielectric in the vicinity of the electrode edge may be avoided.

In another refinement, the electrode layer is not overetched or is only slightly overetched by the dry-etching process, with the overetching time being less than 6 seconds or less than 3 seconds, preferably 0 seconds. The shorter the overetching time, the longer the service life of the capacitor arrangement becomes.

In another refinement, a partial lateral etching of the electrode during the dry etch and in particular during the wet etch is compensated for by a reserve dimension of a mask which is used in a lithography method for patterning the electrode.

In a refinement, the method according to the invention or one of its refinements is used to fabricate a circuit arrangement whose service life under its typical conditions of use is at least 7 years or at least 10 years. The service life of the circuit arrangement is crucially determined by the service life of the capacitor arrangement.

An integrated capacitor arrangement that has been fabricated using the method may include a dielectric layer having a thickness in at least one region which is not covered by the electrode deviates by less than 5 nm or by less than 1 nm from the thickness of the dielectric layer beneath the electrode. At the regions that are not covered by the electrode, the dielectric layer is substantially free of residues of an electrode layer that has been patterned in order to fabricate the electrode. On account of these features, the technical effects of the method according to the invention and its refinements also apply to the capacitor arrangement according to the invention.

In a refinement, a boundary of the section that is close to the electrode is at a distance of at least 3 nm (nanometers) from the electrode and the section is at least about 5 nm wide. The thickness of the dielectric layer varies, for example, by only at most about 1 nm within the section.

In another refinement, the dielectric layer has at least one contact section or a multiplicity of contact sections, known as vias, penetrating through it. This is the case in particular if contact is made from above with the electrode lying directly below the dielectric layer.

The foregoing summary is provided only by way of introduction. The features and advantages of the present invention may be realized and obtained by means of the instrumentalities and combinations particularly pointed out in the claims. Nothing in this section should be taken as a limitation on the claims, which define the scope of the invention. Additional features and advantages of the present invention will be set forth in the description that follows, and in part will be obvious from the description, or may be learned by practice of the present invention.

BRIEF DESCRIPTION OF THE DRAWINGS

The text which follows explains exemplary embodiments of the invention with reference to the appended drawings, in which:

FIG. 1 shows an intermediate stage in the fabrication of a capacitor arrangement with three electrodes;

FIG. 2 shows a further intermediate stage in the fabrication of the capacitor arrangement with three electrodes;

FIG. 3 shows a capacitor with three electrodes;

FIGS. 5A to 5C show intermediate stages in a second lithography method for fabricating a capacitor arrangement with three electrodes of different thickness;

FIGS. 7A to 7D show fabrication stages involved in the fabrication of a capacitor arrangement with nine electrodes;

FIG. 8 shows a capacitor arrangement with nine electrodes;

FIG. 9 shows a capacitor arrangement which extends over four metallization layers and has three single MIM capacitors;

FIG. 10 shows a capacitor arrangement which extends over three metallization layers and has two triple MIM capacitors;

FIG. 11A shows a fabrication stage involved in the fabrication of a capacitor arrangement;

FIG. 11B shows the capacitor arrangement after the dry etching of an electrode layer;

DETAILED DESCRIPTION OF THE INVENTION

Figure 4A:
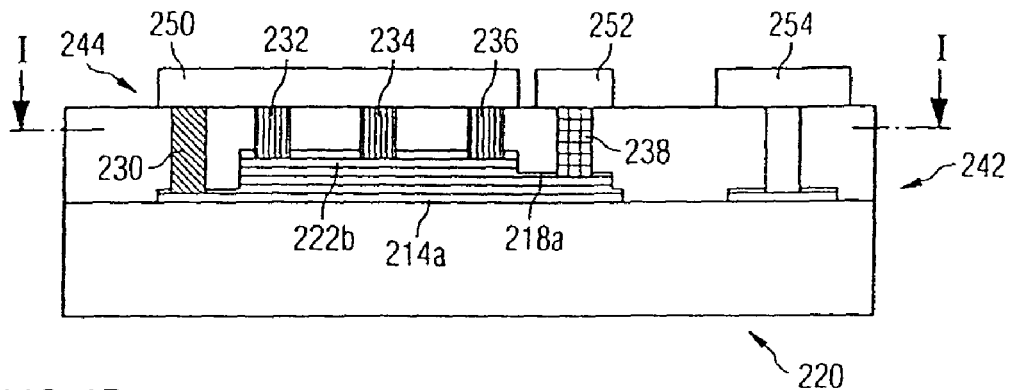
FIGS. 4A to 4C show views of a further capacitor with three electrodes.

Capacitor assemblies will now be described more fully with reference to the accompanying drawings. In each of the following figures, components, features and integral parts that correspond to one another each have the same reference number. The drawings of the figures are not true to scale.

FIG. 1 shows an intermediate stage in the fabrication of a capacitor arrangement 10 that is arranged on a dielectric layer 12. The dielectric layer 12 forms a dielectric between various interconnects of a metallization layer in the interior of an integrated circuit arrangement. By way of example, the dielectric layer 12 has a thickness of 300 nm and consist of silicon dioxide.

A base electrode layer is applied to the dielectric layer 12, for example by sputtering. In the exemplary embodiment, the electrode layers include titanium nitride TiN. The electrode layers have a thickness of, for example, in each case 50 nm.

After a base electrode layer 14 has been applied, a base dielectric layer 16 is applied. The base dielectric layer 16 includes, for example, silicon nitride SiN and is deposited, for example, from a vapor phase. In the exemplary embodiment, the thickness of the base dielectric layer 16 is 50 nm.

After the base dielectric layer 16 has been deposited, a center electrode layer 18 made from titanium nitride TiN is deposited, with a thickness of 50 nm. Then, a covering dielectric layer 20 of silicon nitride is applied in a thickness of 50 nm. Then, a covering electrode layer 22 of titanium nitride is produced with a thickness of 50 nm. A silicon nitride layer 23 with a thickness of 50 nm forms the termination of a layer stack 24 which includes the layers 14 to 22. The layers of the layer stack 24 lie parallel to a wafer surface of a wafer which is not shown in FIG. 1 and also bears the dielectric layer 12.

A photoresist layer 26 is applied to the layer stack 24 and exposed in accordance with the patterns of a photomask. The exposed photoresist layer 26 is developed, with a photoresist layer region 26a remaining on the layer stack 24.

As illustrated in FIG. 2, the layer stack 24 is then etched using a dry etching process, in which, in accordance with the photoresist layer region 26a, the silicon nitride layer 23 is patterned first, followed by the covering electrode layer 22, the covering dielectric layer 20 and the center electrode layer 18. The result is a pre patterned covering electrode 22a, a covering dielectric 20a and a center electrode 18a. The dry etch of the center electrode 18a is selective with respect to the base dielectric layer 16, so that the base dielectric layer 16 is scarcely attacked by the etch (the etching attack is greatly exaggerated in the figures). The dielectric layer 23a and the covering dielectric layer 20 are etched without changing the etching conditions or with a change in the etching conditions.

By way of example, the etching process is divided into:
1. time controlled etch of the dielectric layer 23,
2. etch of the covering electrode layer 18 by means of an etch which is highly elective with respect to the covering dielectric layer 20. Recording this end point in order to end the etching and for process control.
3. Carrying out a nonselective time controlled etch of the covering dielectric layer 20 that is nonselective with respect to the center electrode layer 18.
4. Then, a highly selective etch with end point detection is once again carried out on the base dielectric layer 16.

This procedure ensures a sufficiently wide process window.

As is also illustrated in FIG. 2, a photoresist layer 50 is applied to the layer stack 24a that has already been pre-patterned and the uncovered regions of the base dielectric layer 16. The photoresist layer 50 is exposed and developed in accordance with a second photomask. After the developing step, photoresist regions 52 to 58 of the photoresist layer 50 remain. The photoresist region 52 rests on the base dielectric layer 16 and adjoins the left hand side of the layer stack 24a and defines the extent to which a base electrode which is to be produced projects beyond the center electrode 18a on the left hand side of the capacitor arrangement 10. The photoresist region 54 rests on a central region of the dielectric layer 23a which has already been pre-patterned. The photoresist region 54 defines the position of the covering electrode and at the same time the extent to which the center electrode 18a projects with respect to the completed covering electrode.

A photoresist region 56 rests on the base dielectric layer 16 on the right-hand side of the layer stack 24a. The photoresist region 56 protects an edge region 60 of the base dielectric layer 16 from further etching attack. Moreover, the photoresist region 56 defines the extent to which the base electrode to be produced projects with respect to the center electrode 18a on the right hand side of the stack.

The photoresist region 58 is separated from the photoresist region 56 by a recess 62 and serves to define the structure of an interconnect in the base electrode layer 16. This interconnect is not intended to form part of the capacitor arrangement 10. Then, the pre-patterned covering electrode 52a and the base electrode layer 14 are etched by means of a dry-etching process. In this case, the following stack sequence is etched in targeted fashion, making use of the selectivity of the metal etch with respect to the dielectrics:

time controlled etching of the "pre patterned dielectric layer 23a, etching of the metallic pre patterned covering electrode 22a, stopping in the pre patterned covering dielectric 20a. In this case, the base dielectric layer 16 and then the base electrode layer 14 are patterned simultaneously. If appropriate, targeted overetching is carried out in order to ensure that the dielectric layer 12 is reached. Another option for increasing the size of the process window is explained in more detail below with reference to FIGS. 5A to 5C.

The method which has been explained with reference to FIGS. 1 and 2 results in a capacitor arrangement 10 which equates to a capacitor arrangement 110 shown in FIG. 3 apart from minor differences. Similar components of the capacitor arrangement 110 to components of the capacitor arrangement 10 are denoted by the same reference symbols, but prefixed with a 1 (e.g., the base electrode is denoted by reference symbol 114a). An interconnect 114b which has been patterned by a photoresist region corresponding to the photoresist region 58 is likewise illustrated in FIG. 3. On the base electrode 114a there is a base dielectric layer 116a, which has been only slightly attacked by the etch used to produce the layer stack 124b. Above the interconnect 114b there is a remaining region 116b of the dielectric layer from which the dielectric layer 116a is also formed.

During the patterning of the layer stack 124b, the covering electrode 122b and the center electrode 118a were formed with their left hand edges flush with one another perpendicular to the semiconductor wafer. This is achieved by virtue of the resist which covers the dielectric layer 123a extending all the way to the left hand edge of the dielectric layer 123a after the developing step (cf. dashed line 130 in FIG. 2). Alternatively, by shortening the photoresist region it is also possible to achieve patterning in which damage in the edge region of the covering dielectric 120a is rendered harmless in circuitry terms by shortening the covering electrode 122b on the left hand side (cf. dashed line 132 in FIG. 2).

As can be seen from the sectional illustration presented in FIG. 3, a dielectric layer 140, for example made from silicon dioxide, was then deposited on the layer stack 124b. The dielectric layer 140 forms a dielectric between the metallization layers 142 and 144. The metallization layer 142 includes, for example, the base electrode 114a and the interconnect 114b. The metallization layer 144 includes, inter alia, three interconnects 150 to 154, made from aluminum, for example. In the exemplary embodiment, the thickness of the metallization layer 144 is greater than the thickness of the metallization layer 142.

The interconnect 150 is used to electrically connect the base electrode 114a and the covering electrode 122b. Three via fillings 160 to 164 lead from the interconnect 150 to the base electrode 114a. The via fillings 160 to 164 correspond to three rows of via fillings that extend on the left-hand region of the base electrode 114a. Three via fillings 170 to 174, which form part of three rows of via fillings extending on the covering electrode 122b, lead from the interconnect 150 to the covering electrode 122b. Three via fillings 180 to 184, that form part of three via rows extending along a right-hand region of the center electrode 118a, lead from the interconnect 152 to the center electrode 118a. This right-hand region is not covered by the covering electrode 122b.

A via filling 190 leads from the interconnect 154 to the interconnect 114b. During the etching of contact holes for the via fillings 160 to 190, the bottom of the contact holes for the via fillings 160 to 190 penetrated through the dielectric layers of the layer stack 124b or the dielectric layer 116b. Consequently, the capacitor arrangement 110a includes two capacitors C1 and C2 which are connected in parallel (cf. circuit sketch 192 in FIG. 3).

Figure 4B:
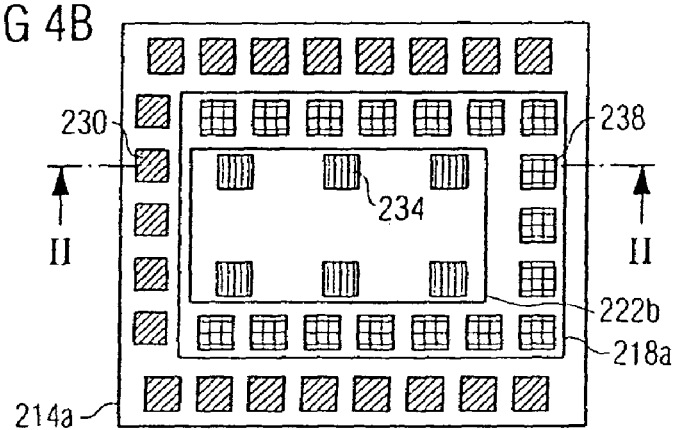

FIG. 4A shows a sectional illustration through a capacitor arrangement 220 along a section plane II (cf. FIG. 4B). The capacitor arrangement 220 was fabricated using the method explained above with reference to FIGS. 1 to 3. Consequently, the capacitor arrangement 220 includes a rectangular base electrode 214a, a center electrode 218a and a covering electrode 222b. An upper metallization plane 244 includes, inter alia, three interconnects 250, 252 and 254. The interconnect 250 is used to connect the base electrode 214a and covering electrode 222b. The interconnect 252 is used to connect the center electrode 218a. In FIG. 4A, a via filling 230 is arranged between the interconnect 250 and the base electrode 214a, three via fillings 232 to 236 are arranged between the interconnect 250 and the covering electrode 222b, and a via filling 238 is arranged between the interconnect 252 and the center electrode 218a, as seen in the section plane II. The interconnect 258 is used to connect an interconnect in the metallization layer 242.

FIG. 4B shows a plan view of the capacitor arrangement 210 in section in a section plane I, the position of which is indicated in FIG. 4A. The base electrode 214a has the largest area. The center electrode 218a has a smaller area than the base electrode 214a. The covering electrode 222b has a smaller area than the center electrode 218a. The center electrode 218a is arranged closer to the right hand edge of the base electrode 214a than to the left-hand edge of the base electrode 214. via fillings 230 may be arranged at the lower edge of the base electrode 214a, at the left hand edge of the base electrode 214a and at the upper edge of the base electrode 214a.

By contrast, the covering electrode 222b is arranged closer to the left hand edge of the center electrode 218a than to the right-hand edge of the center electrode 218a. Consequently, via fillings 238 may be arranged at the lower edge of the center electrode 218a, at the right-hand edge of the center electrode 218a and at the upper edge of the center electrode 218a.

In the exemplary embodiment, contact is made with the covering electrode 222b by means of six via fillings 234, which end either in a corner or in the center of a longitudinal side of the covering electrode 222b.

Figure 4C:
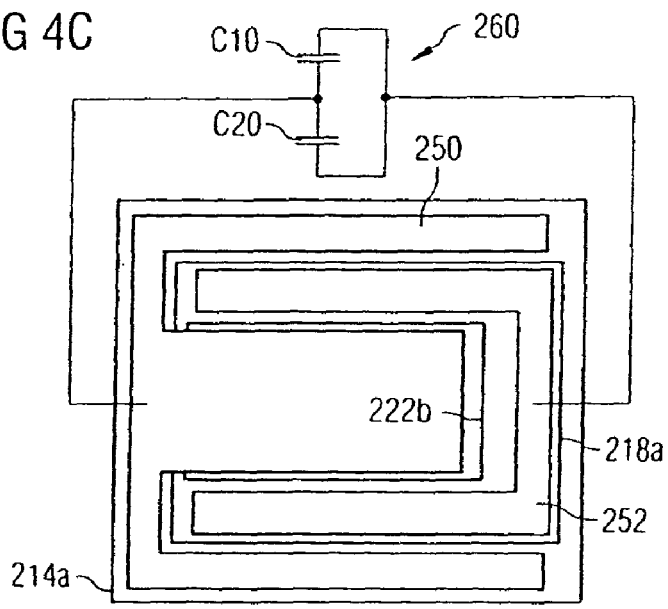

FIG. 4C shows a plan view of the capacitor arrangement 220a. The path of the interconnects 250 and 252 in the metallization layer 244 is shown. FIG. 4C also illustrates a circuit sketch 260 showing the way in which capacitors C10 and C20 of the capacitor arrangement 220a are connected. The two capacitors C10 and C20 are connected electrically in parallel with one another.

In another exemplary embodiment, the base electrode 214a is connected via the metallization layer 242 or a metallization layer lying below this metallization layer 242.

During production of the contact holes, an oxide etch, which is highly selective with respect to the electrode material or with respect to the dielectric, is carried out for the via fillings. It is preferable to use an etch with end point control, since the depth of the contact holes differs for each electrode.

FIGS. 5A to SC show intermediate stages of a second lithography method in accordance with a further exemplary embodiment. A capacitor arrangement 310 is produced on a dielectric layer 312 that forms the dielectric between two adjacent metallization planes and contains, for example, silicon dioxide. A titanium nitride layer 314, a silicon nitride layer 316, a titanium nitride layer 318, a silicon nitride layer 320 and a titanium nitride layer 322 are successively deposited on the dielectric layer 312 to produce a layer stack 313. The layers 314 to 320 all have the same thickness of 50 nm or 45 nm (nanometers). The upper titanium nitride layer 322 of the layer stack 313, on the other hand, is more than about twice as thick as the titanium nitride layer 318, specifically, in the exemplary embodiment, is about 200 nm thick.

On account of the increased thickness of the upper titanium nitride layer 322, no further dielectric layer may be applied to the layer stack 313 before the patterning of the layer stack 313 commences. The upper titanium nitride layer 322, the dielectric layer 320 and the titanium nitride layer 318 are successively patterned with the aid of a photoresist layer (not shown in FIG. 5A). The procedure used is that which has been explained above with reference to FIGS. 1 and 2. In particular, in one configuration the titanium nitride layers 322 and 318 are etched with the aid of end point detections. Traces of the material of the dielectric layer 320 or 316 or of a characteristic reaction product of this material with an etching gas are recorded in the etching gas, for example with the aid of spectral analysis.

Then, a photoresist layer 350 is applied to the pre-patterned layer stack 313 and to the uncovered parts of the silicon nitride layer 316. Photoresist regions 352 to 358, which are arranged, in this order, at the same locations with respect to the layer stack 313 as the photoresist layer regions 52 to 58 with respect to the layer stack 24a, are produced with the aid of an exposure and developing operation. However, the photoresist region 354 rests directly on the upper pre-patterned titanium nitride layer 322. The photoresist layer 350 is designed to be thicker than the photoresist layer 50, so that the edges of the layer stack 313 are completely covered by the photoresist regions 352 and 356.

After the patterning of the photoresist layer 350, the lower silicon nitride layer 316 is patterned, as illustrated in FIG. 5B, leading to the formation of a base dielectric 316a and a dielectric 316b. This etch is carried out, for example, with time control. Then, the lower titanium nitride layer 314 is patterned, so as to form a base electrode 314a and an interconnect 314b.

This etch is carried out with the aid of end point detection in which material of the dielectric layer 312 or of a characteristic etching product of this material is recorded by means of spectral analysis. At the time at which the base of a recess 362 located between the photoresist region 356 and 358 reaches the dielectric layer 312, the titanium nitride layer 322 has only been partially patterned (cf. titanium nitride layer 322a). In particular, the pre-patterned silicon nitride layer 320 is not yet uncovered.

Figure 5C:
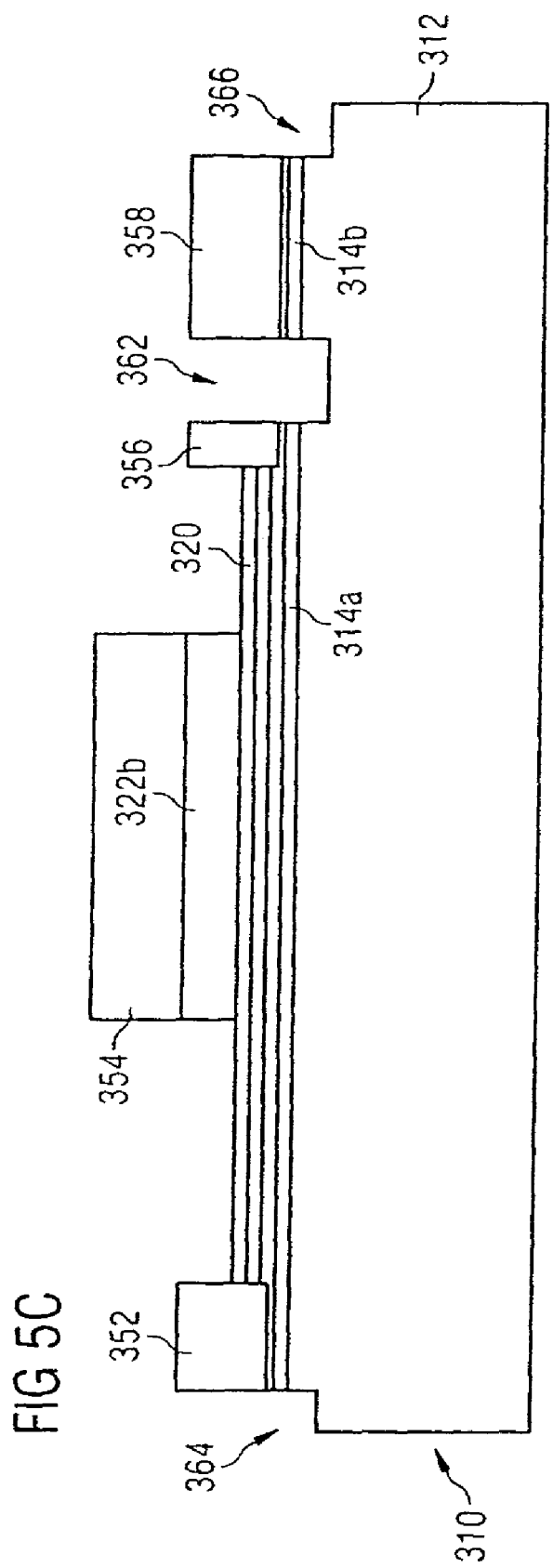

Then, a further selective etch is carried out, in which the titanium nitride layer 322a is completely patterned. As illustrated in FIG. 5C, a covering electrode 322b is thereby formed from the titanium nitride layer 322a which has already been pre-patterned. The patterning of the covering electrode 322b is ended with the aid of end point detection as soon as material of the dielectric layer 320 or a characteristic etching product of this material is recorded in the etching gas. At this time, the base of the recess 362 already extends into the dielectric layer 312. Moreover, there are recesses 364 and 366 on the left-hand side of the photoresist region 352 and on the right hand side of the photoresist region 356, respectively, in the dielectric layer 312. Only then are the photoresist regions 352 to 358 removed again.

In another exemplary embodiment, with titanium nitride layers 314, 318 and 322 of different thicknesses, only the etch of the covering electrode 322b is carried out with the aid of an end point detection. In both process variants, however, the covering electrode 322b is thicker than the base electrode 314a. This measure ensures that the base electrode 314a has been completely patterned after complete patterning of the covering electrode 322b. In particular, there are no longer any residues of material from the titanium nitride layer 314 between the base electrode 314a and the interconnect 314b.

Figure 6A:
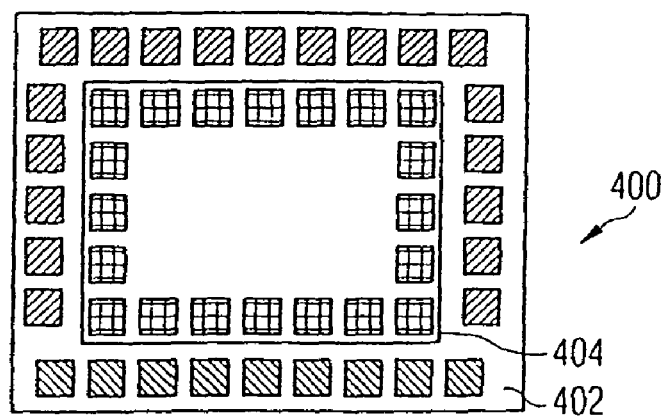
FIGS. 6A to 6C show a comparison of the surface area required for different capacitor arrangements.

FIG. 6A shows a reference capacitor 400, which includes just two electrodes, namely a lower rectangular base electrode 402 and a rectangular covering electrode 404 arranged above it. Base electrode 402 and covering electrode 404 are arranged concentrically with respect to one another. The base electrode 402 is 150 µm long and 100 µm wide. The covering electrode 404 is only 145 µm long and 95 µm wide and an active surface area for the capacitance of the reference capacitor 400 is 145 µm×95 µm.

Figure 6B:
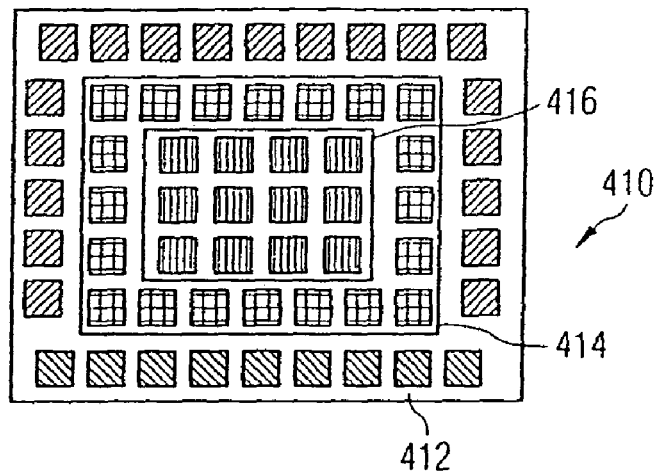

FIG. 6B shows a capacitor 410 that includes a base electrode 412, a center electrode 414 and a covering electrode 416, which, in the order given, have the following dimensions: 150 µm×100 µm, 145 µm×95 µm and 140 µm×90 µm. This results in a surface area which is effective for the capacitance of the capacitor 410 of 145 µm×95 µm+140 µm×90 µm, i.e. a total of 26,375 µm$^2$. This corresponds to an increase in the overall capacitance compared to the capacitor 400 of over 90%. Consequently, for the capacitance to remain the same, the surface area required for the capacitor 412 can be almost halved compared to the surface area required for the capacitor 400. The vias are illustrated on an exaggerated scale compared to the electrodes in FIGS. 6A to 6C. The via diameter is, for example, 0.4 µm. The distance between the edges of two adjacent vias is, for example, likewise 0.4 µm.

Figure 6C:
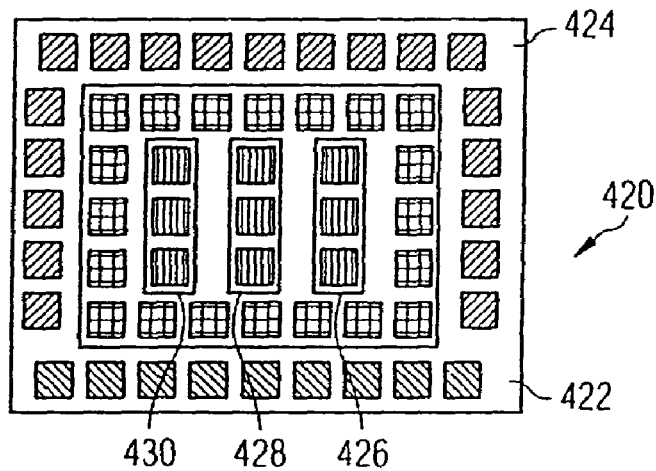

FIG. 6C shows a capacitor 420 which includes a base electrode 422 with a length of 150 µm and a width of 100 µm. A center electrode 424 arranged above the base electrode 422 is 145 µm long and 95 µm wide. Three covering electrodes 426 to 430 are arranged next to one another, above the center electrode 424, in a plane which lies parallel to a wafer surface or chip surface. The covering electrodes 426 to 430 are in each case 90 µm long and 30 µm wide. The capacitor 420 requires the same surface area as the capacitor 400, but the three covering electrodes 426 to 430 can optionally be connected up to the main capacitance between base electrode 422 and center electrode 424. By way of example, just one covering electrode, for example the covering electrode 426, is connected up. However, it is also possible for two or all three covering electrodes 426 to 430 to be connected up to the main capacitance.

The basic concept of the invention can also be expanded to cover capacitor arrangements which include more than three electrodes, for example to cover a capacitor arrangement 500 having nine electrodes S1 to S9. Dielectric layers D1 to D8 are located in this order between the electrodes S1 to S9. A dielectric layer D9 is arranged on the electrode S9. In the exemplary embodiment explained below, the electrodes S1 to S9 and the dielectric layers D1 to D9 have the same thickness of, for example, 45 nm. FIGS. 7A to 7D which are explained in the text which follows illustrate only the left-hand side of a layer stack 502 that is to be patterned. The right-hand side of the layer stack is patterned in the same way as the left-hand side.

In a first lithography method, the electrode layers for the electrodes S4 to S9 and the dielectric layers D4 to D9 are patterned. The dielectric layer D3 serves as an etching stop. The dielectric layer D3 itself and the electrode layers for the electrodes S1 to S3, and also the dielectric layers D1 and D2, remain unpatterned during the first lithography method. A photoresist layer 504 is applied to the layer stack 502 produced in this way. The photoresist layer 504 is patterned in a second lithographic method, producing two photoresist regions 506 and 508. The photoresist region 506 bears on part of the uncovered region of the dielectric layer D3. On the left hand side, the photoresist region 506 defines the left-hand edge for the patterning of the electrode layers for the electrodes S1 to S3. On the right hand side, the photoresist region 506 adjoins the electrode layers for the electrodes S4 and S5 and the dielectric layer D4 between them. The photoresist region 508 rests on the dielectric layer D9 in a central region, so that an edge region of the dielectric layer D9 remains uncovered. The left-hand edge of the photoresist region 508 defines the position of the edges of a stack comprising the electrode layers for the electrodes S7 to S9 and the dielectric layers D7 and D8 between them.

Then, a dry chemical etching process is carried out, in particular a chemical physical etching process with a high degree of anisotropy. The result is the layer stack 520 with three steps (cf. arrows 522 to 526 illustrated in FIG. 7B).

As illustrated in FIG. 7B, a photoresist layer 530 is applied, exposed and patterned as part of a third lithography method, so that four photoresist regions 532 to 538 are formed. The photoresist region 532 rests on the dielectric 501 which bears the layer stack 520, so that the dielectric 501 is protected from further patterning. The photoresist region 534 rests on the right hand ⅔ of the uncovered region of the dielectric layer D3 in the left-hand part of the layer stack 520, with its right hand side adjoining the electrode layers for the electrodes S4 and S5 and the dielectric layer D4 between them. The left hand side of the photoresist region 534 defines the position of the edges of the electrode layers for the electrodes S2 and S3 during the next patterning.

The photoresist region 536 rests on the dielectric layer D6. The photoresist region 536 covers the right-hand ⅔ of the uncovered region of the dielectric layer D6 on the left-hand side of the layer stack 520. The left hand edge of the photoresist region 536 defines the position of the edges of the electrode layers for the electrodes S5 and S6 following the next patterning step. The right-hand edge of the photoresist region 536 adjoins the electrode layers for the electrodes S5 and S8 and the dielectric layer D7 between them.

The photoresist legion 538 lies in a central part of the dielectric layer D9. The left hand edge of the photoresist region 538 defines the position of the left-hand edges of the electrode layers for the electrodes S8 and S9 and the dielectric layer D8 between them after the next patterning.

During the next patterning with the aid of the photoresist regions 532 to 538, targeted etching is carried out with the aid of a chemical physical etching method. An end point detection of the material of the dielectric layer D1, D4 and/or D7, which are all reached substantially simultaneously, serves as a stop layer.

Figure 7C:
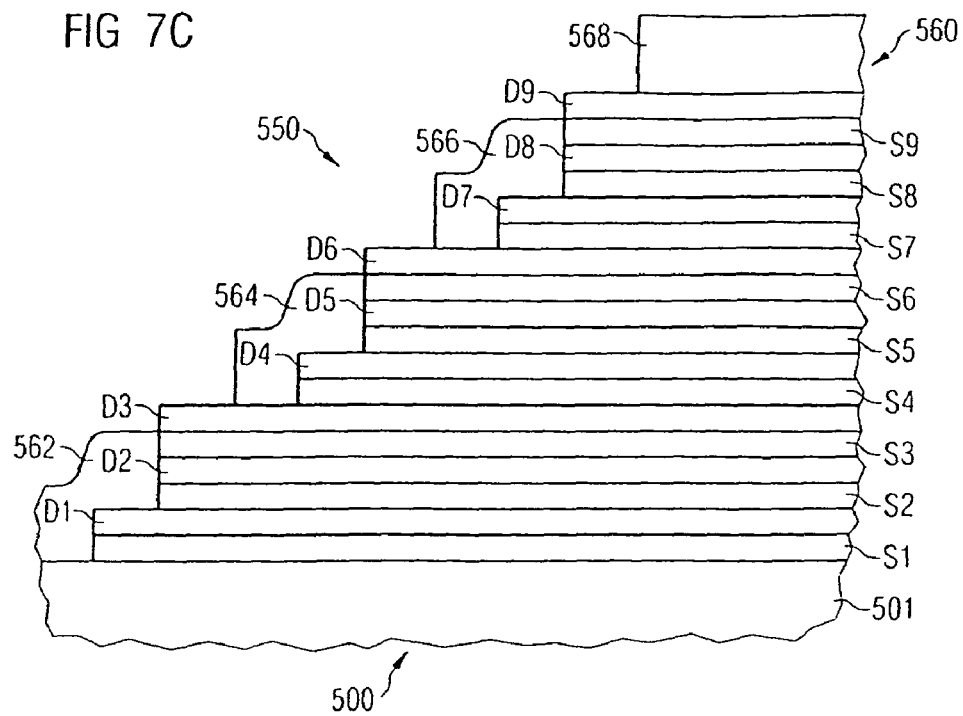

FIG. 7C shows a layer stack 550 as is present on the layer 501 after this etch. In a fourth lithography method, a photoresist layer 560 is applied to the layer stack 550, exposed and developed, forming photoresist regions 562 to 568. The photoresist region 562 covers the dielectric layer 501 and the uncovered region of the dielectric layer D1. The photoresist region 564 covers about half of the uncovered region of the dielectric layer D3 on the left hand side of the layer stack 550 and the uncovered part of the dielectric layer D4. The photoresist region 566 covers the right-hand half of the uncovered region of the dielectric layer D6 on the left hand side of the 'layer stack 550 and the uncovered part of the dielectric layer D7. The photoresist region 568 rests in a central region on the dielectric layer D9. A left-hand edge region on the dielectric layer D9 remains uncovered.

Figure 7D:
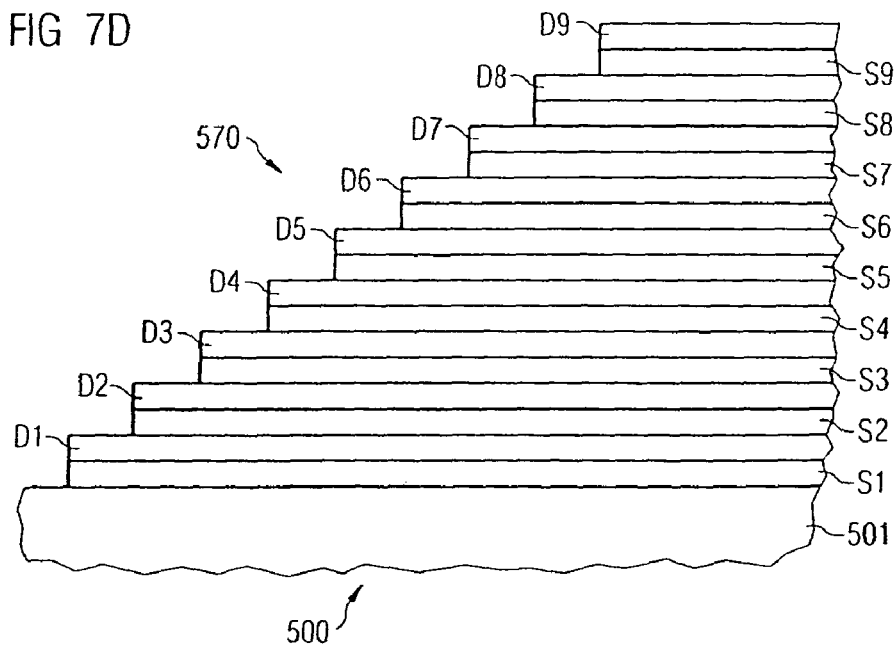

FIG. 7D shows the result after the next etching step. A layer stack 570 is of pyramid like structure and has steps of the same height and the same width. On account of this stepped arrangement, it is easy to make contact with the electrodes S1 to S9 from above. On account of the stepped arrangement, there is also no etching through dielectric layers D1 to D9 directly at the edge of two electrodes S1 to S9 arranged flush with one another. The dielectric strength of the capacitor 500 may therefore very high.

FIG. 8 shows a capacitor arrangement 600 which likewise includes nine electrodes. The capacitor arrangement 600 is patterned asymmetrically in such a way that it is only possible to make contact with electrodes S1, S3, S5, S7 and S9, i.e. only every other electrode, at the steps on the left-hand side. By contrast, contact can be made with the electrodes S2, S4, S6 and S8 on the right-hand side of the capacitor arrangement 600. The method steps involved in fabricating the capacitor arrangement 600 are similar to those involved in the fabrication of the capacitor arrangement 500. There are also no problems with the exposure of resist on different steps of very large layer stacks if the method operates within the limits of the depth of focus. By way of example, the depth of focus is 1 µm.

In another exemplary embodiment, the lower electrode of the capacitor arrangement lies above the lower metallization layer with respect to the two metallization layers between which the capacitor arrangement is arranged.

In a further exemplary embodiment, the lower electrode of the capacitor arrangement has already been formed in the metallization layer even before beginning, for example by means of a Damascene process with subsequent polishing step. The other electrodes of the capacitor arrangement are then fabricated using the method which has been explained.

In alternative exemplary embodiments, the lower electrode of the capacitor arrangement is connected via at least one metallization layer lying at a lower level than this electrode.

FIG. 9 shows a capacitor arrangement 700 which includes four metallization layers Me1 to Me4 above a semiconductor substrate (not shown). Each metallization layer Me1 to Me4 includes a multiplicity of interconnects made from an aluminum alloy with an addition of copper amounting to less than 2%. However, FIG. 9 illustrates only the interconnects of the metallization layers Me1 to Me4, which belong to the capacitor arrangement 700. Interconnects for connection of active components in the semiconductor substrate are therefore not shown.

The metallization layers Me1 to Me4 are electrically insulated from one another in this order by interlayers ILD1 to ILD3 formed, for example, from silicon dioxide. By way of example, the metallization layers Me1 to Me4 each have a thickness of 500 nm. The distances between adjacent metallization layers Me1 to Me4 are, for example, in each case 800 nm.

Thus far, conventional layer deposition, lithography and patterning methods have been used to fabricate the capacitor arrangement 700, and consequently these methods are not explained in more detail in the present context. A lower electrode 710 is located in the metallization layer Me1. A dielectric, 714 is located between the electrode 710 and a partial electrode 712 above it. The partial electrode 712 is formed by a 45 nm thick titanium nitride layer. The dielectric 714 is a 45 nm thick silicon nitride layer. In the exemplary embodiment, the electrodes of the capacitor arrangement 700 have a rectangular basic area, with a length L lying in the longitudinal direction of the rectangles. The length L of the partial electrode 712 is, for example, 150 µm.

The lower electrode 710 and the dielectric 714 project beyond the partial electrode 712. During the patterning of the partial electrode 712, the dielectric 714 served as an etching stop and was only lightly etched, meaning that the illustration in FIG. 9 is exaggerated. The lower electrode 710 extends further beyond the partial electrode 712 on the left hand side than on the right-hand side. This results in the formation of a connection surface for a contact section Via1, which is located between an interconnect 718 of the metallization layer Me1 and the electrode 710. The contact section Via1 is part of a row of contact sections between an interconnect 718 in the metallization plane Me1 and the base electrode 710.

A partial electrode 720, which is connected to the partial electrode 712 via contact sections Via2 and Via3, is likewise located in the metallization layer Me1. The contact sections Via2 and Via3 form part of two rows of vias between the partial electrodes 712 and 720. The partial electrodes 712 and 720 form a center electrode of the capacitor arrangement 700.

A partial electrode 720, which is separated from the partial electrode 720 by a dielectric 724, is located in the interlayer ILD2, adjacent to the partial electrode 720. The partial electrode 722 consists of a 45 nm thick titanium nitride layer. The dielectric 724 in turn consists of a 45 nm thick silicon nitride layer. The partial electrode 722 is also of the length L. The partial electrode 720 and the dielectric 724 project beyond the partial electrode 722 on the right-hand and left-hand sides. The dielectric 724 likewise served as an etching stop in the production of the partial electrode 722 and was only slightly attacked. These measures do not damage the dielectric 724 at the sensitive edge region of the electrode 722.

The partial electrode 720 projects beyond the partial electrode 722 to a greater extent on the right hand side than on the left-hand side, so that a connection surface is formed for a contact section Via4 which extends between the partial electrode 720 and an interconnect 728 in the metallization layer Me3. The contact section Via4 is also part of a row of contact sections between the interconnect 728 and the partial electrode 720.

Moreover, a partial electrode 730 which, together with the partial electrode 722, forms the second center electrode of the capacitor arrangement 700 is located in the metallization layer Me3. The partial electrodes 722 and 730 are connected to one another by means of two rows of vias, of which two contact sections Via5 and Via6 are illustrated in FIG. 9. The partial electrode 730 is separated from the interconnect 728 by parts of the interlayer ILD3, cf. space 731. The upper center electrode comprising the partial electrodes 722 and 730 is electrically connected to the lower electrode 710 by means of two rows of contact sections positioned above one another. The upper row leads from the partial electrode 730 to the interconnect 719. FIG. 9 illustrates a contact section Via1 belonging to this row of contact sections. The contact section Via1 belongs to the lower row.

Finally, the capacitor arrangement 700 also includes an upper electrode 732, which is separated from the partial electrode 730 by a dielectric 734. The partial electrode 732 likewise consists of titanium nitride and has a thickness of 45 nm. The dielectric 734 consists of silicon nitride and has a thickness of 45 nm. During the patterning of the upper electrode 732, the dielectric 734 was used as an etching stop and was only etched slightly (cf. the exaggerated illustration in FIG. 9). The partial electrode 730 projects beyond the upper electrode 732 on the left hand side and the right hand side together with the dielectric 734. The partial electrode 730 projects further beyond the upper electrode 732 at the left hand edge than at the right-hand edge, resulting in a connection option for that row of contact sections to which the contact section Via1 also belongs.

The upper electrode 732 is likewise of the length L. All the electrodes 732, 722 and 712 in interlayers ILD3, ILD2 and ILD1, respectively, are aligned flush above one another (cf. dashed lines 736 and 738), and have identical contours.

The upper electrode 732 is connected to an interconnect 740 located in the metallization layer Me4 via two rows of contact sections. FIG. 9 illustrates two contact sections Via8 and Via9 belonging to these two rows. A row of contact sections extends from the right-hand part of the interconnect 740 to the interconnect 728 (cf. contact section Via10). In this way, the upper electrode 732 is electrically conductively connected to the lower center electrode, i.e. the partial electrodes 712 and 720 of the capacitor arrangement 700.

The left-hand parts of the interconnect 740 and of the partial electrode 730 are used to connect the capacitor arrangement, so that a total capacitance Ctot is formed between these parts.

Moreover, FIG. 9 illustrates a circuit sketch 750 showing the way in, which capacitances C1, C2 and C3 of the capacitor arrangement 700 are connected. The capacitance C1 is formed by the lower electrode 710 and by the partial electrode 712. The capacitance C2 is formed by the partial electrode 720 and the partial electrode 722. The capacitance C3 is formed by the partial electrode 730 and by the upper electrode 732. The capacitances C1 to C3 are connected electrically in parallel to one another, which is achieved by the meshing arrangement of the electrodes in the capacitor arrangement 700.

In another exemplary embodiment, the capacitor arrangement 700 includes only two MIM capacitors, so that, by way of example, only the metallization layers Me1 to Me3 are included in the capacitor arrangement. In this case, the capacitance per unit area is not tripled, but rather is only doubled (cf. dashed line 752 in the circuit sketch 750). This is because in this case the capacitor arrangement includes only the capacitances C1 and C2.

In a further exemplary embodiment, the capacitor arrangement extends over more than four metallization planes. In this way, it is possible to multiply the capacitance per unit area fourfold, fivefold, etc. By way of example, the metallization layer Me4 would be patterned in the same way as the metallization layer Me2. Above the metallization layer Me4 there would be a metallization layer Me5 which would be patterned in the same way as the metallization layer Me3. Contact sections Via1, Via7, etc., to which the lower electrode 710, the second center electrode, the fourth center electrode, etc., are connected, would be positioned above one another on the left-hand side of the capacitor arrangement 700. Contact sections Via4, Via10, etc., by means of which the first center electrode, the third center electrode, etc., and the covering electrode are connected to one another, lie on the right-hand side of the capacitor arrangement.

Consequently, the patterns of the electrodes in the capacitor arrangement recur. This means that identical partial sections of masks can be used for the lithography. In particular, all the electrodes 712, 722, 732 in interlayers ILD1 to ILD3 are produced in accordance with the same layout.

FIG. 10 shows a capacitor arrangement 800 which extends over three metallization layers 802, 804 and 806. The metallization layer 802 rests on an interlayer 810 which consists, for example, of silicon dioxide. An interlayer 812, which likewise consists of silicon dioxide, is located between the metallization layers 802 and 804. An interlayer 814 made from silicon dioxide is likewise located between the metallization layers 804 and 806. Starting from a lower electrode 820 and progressing toward electrodes further from the substrate, the capacitor arrangement 800 includes, in the following order:

an electrode 822,
an electrode 824,
a partial electrode 826,
a partial electrode 828,
an electrode 830,
an electrode 832, and
upper electrode 834.

The lower electrode 820 and the partial electrode 828 are located in the metallization layer 802 and 804, respectively, and in the exemplary embodiment consist of an aluminum alloy containing less than 5% of added copper and/or silicon. In the exemplary embodiment, the metallization layers 802 to 806 are, for example, 500 nm thick. The distance between adjacent metallization layers is 750 nm in the exemplary embodiment. The electrodes 822, 824, the partial electrode 826, the electrodes 830, 832 and the partial electrode 834 consist of titanium nitride, each with a thickness of 45 nm.

Dielectrics 840 to 852 are located in this order between the electrodes 820 to 834. A dielectric 854 also rests on the upper electrode 824. The dielectrics 840 to 854 consist of silicon nitride and in the exemplary embodiment have a layer thickness of 45 nm. The dielectric 846 rests on the partial electrode 826.

The lower electrode 820, the electrode 824, the electrode 830 and the upper electrode 834, i.e. every second electrode of the capacitor arrangement 800 starting from the lower electrode 820, are electrically connected to one another by means of four contact sections Via11 to Via14 on the left hand side and by means of an interconnect 860 in the metallization layer 804 and an interconnect 862 in the metallization layer 806. Three contact sections Via15 to Via17 on the right-hand side and one interconnect 864 in the metallization layer 804 electrically connect the electrodes 822, an electrode comprising the partial electrodes 826 and 828 and the electrode 832 to one another, i.e. every second electrode of the capacitor arrangement starting with the electrode 822 which adjoins the lower electrode 820. The contact sections Via11 to Via17 are each part of a row of contact sections which in each case extend into and out of the plane of the drawing.

The electrode 822, the dielectric 842, the electrode 824, the dielectric 844, the partial electrode 826 and the dielectric 846 form a layer stack 870. The layers of the layer stack 870 are deposited in succession and are then patterned with the aid of simply two lithography methods. The electrode 824 and the dielectric 844 are patterned, and the partial electrode 826 and the dielectric 846 are pre-patterned, by a first lithography method. The electrode 822 and the dielectric 842 are patterned by means of the second lithography method. Moreover, the partial electrode 826 and the dielectric 846 are patterned with the aid of the second lithography method. A third lithography method is required in order to pattern the electrode 828 and therefore also the dielectric 848.

Then, the interlayer 812 is produced and planarized. Next, via holes for the contact sections Via11, Via12 and Via15 and for contact sections Via18 and Via19 are etched and filled. The contact sections Via18 and Via19 lead to the partial electrode 826 and form part of two parallel rows of contact sections.

Then, an aluminum layer and a dielectric 848 are applied to the interlayer 812. After the dielectric 848 has been deposited, a layer stack 872, which includes layers for the electrode 830, for the dielectric 850, for the electrode 832, for the dielectric 852, for the upper electrode 834 and for the dielectric 854, is produced. The layer stack 872 is also patterned using the same method as used for the layer stack 870. A further lithography method is required in order to pattern the electrode 828 and therefore also the dielectric 848.

Then, the material of the interlayer 814 is deposited. After a planarization step, contact holes for the contact sections Via13, Via14, Via16 and Via17 and for two contact sections Via20 and Via21 are produced. In the finished capacitor arrangement 800, the contact sections Via20 and Via21 lie between the interconnect 862 and the upper electrode 854. The contact sections Via20 and Via21 also form part of two rows of contact sections between the interconnect 862 and the upper electrode 854.

A circuit sketch 880 shows the connection of capacitances C1a to C6a of the circuit arrangement 800. The capacitance per unit area is multiplied sixfold by the arrangement of the capacitances C1a to C6a. In the capacitor arrangement 800 too, the partial electrode 826 and the partial electrode 834, i.e. the upper electrodes of the layer stack 870 and 872, respectively, are flush (cf. dashed lines 882 and 884).

In another exemplary embodiment, the electrodes 824 and the dielectric 844 are not present in the layer stack 870 (cf. brace 881a). The electrode 830 and the dielectric 850 are also not included in the layer stack 872 (cf. brace 881b). The contact sections Via12 and Via14 are eliminated. The interconnect 860 is electrically conductively connected to the partial electrode 828. The right-hand part of the partial electrode 828 is designed as its own interconnect and is connected to the contact sections Via15 and Via17. The contact section Via15 is used to connect the electrode 824 which is extended to the right.

In a further exemplary embodiment, copper metallization layers are used instead of aluminum metallization layers in the capacitor arrangements 700 and 800. In this case, also known as a Damascene process, which in each case ends with a chemical mechanical polishing step, is used to produce a metallization layer. If copper is used, the titanium nitride is replaced by tantalum nitride.

In other exemplary embodiments with aluminum or copper electrodes, TiN or TaN liners are used as mediators between the electrodes and the dielectric in order, for example, to reduce the roughness or to increase the bonding.

The capacitor arrangements explained are stored in design libraries as standard components for the chip designer. Therefore, the designer can choose between single-MIM capacitors, dual capacitors, triple capacitors, etc., or between capacitor arrangements which extend over a plurality of metallization layers and for their part include a plurality of single-MIM, dual-MIM or triple-MIM capacitors, etc., or a combination of these capacitors.

The methods used to fabricate the capacitor arrangements explained with reference to FIGS. 9 and 10 result, inter alia, in:
- multiple integration of MIM capacitors in a metallization BEOL (back end of line),
- if appropriate use of a partial mask for patterning all the MIM capacitors,
- an increase in the achievable capacitance per unit area of a standard MIM capacitor by a multiple, and
- the arrangements proposed can be used to produce capacitances'~ with a high quality and a high linearity.

In particular, in the capacitor arrangements 700 and 800 measures are also taken to avoid damage at the edge of the dielectric, for example the use of a projection and/or the combination of a dry etch and a wet etch or wet cleaning.

Sets of capacitor arrangements 700 or 800 in which certain contact sections are omitted in order to reduce the total capacitance are also produced. By way of example, in the capacitor arrangement 800 the contact section Via11 is omitted, so that the capacitance C1ano longer contributes to the total capacitance C.

FIG. 11A shows an integrated circuit arrangement 1100 which includes a semiconductor wafer, for example a silicon wafer (not shown). Active regions of a multiplicity of electronic components, e.g. of transistors, are located in or on the semiconductor wafer.

After the active electronic components have been produced, if appropriate after the deposition of further layers a dielectric layer ILD is applied, in the exemplary embodiment located between two metallization layers. The upper one of these two metallization layers is formed in a titanium nitride layer 1102 which has been applied to the dielectric layer ILD. In the exemplary embodiment, the titanium nitride layer 1102 has a thickness D1 of 45 nm.

A silicon nitride layer 1104 as dielectric layer with a thickness D2 of, for example, 100 nm is applied to the titanium nitride layer 1102. Then, a further titanium nitride layer 1106, which has a thickness D3 of 45 nm, is applied to the silicon nitride layer 1104.

After the upper titanium nitride layer 1106 has been produced, a photoresist layer 1110 is applied. Then, the photoresist layer 1110 is exposed, by means of a mask. After the exposure step, the photoresist layer 1110 is developed, forming a photoresist region 1112.

As illustrated in FIG. 11B, a plasma etching process is then carried out, in which the titanium nitride layer 1106 is patterned. A covering electrode 1120 of the capacitor arrangement to be produced is formed beneath the photoresist region 1112. The thickness of the covering electrode 1120 is equal to the thickness D3 (i.e. 45 nm). By contrast, the titanium nitride layer is almost completely removed in the region which is not covered by the photoresist region 1112. There are just a few residues 1122 and 1124 of the titanium nitride layer 1106 in a region B which is not covered by the photoresist. The residues 1122 and 1124 only have a thickness of, for example, 1 nm or 2 nm.

During the plasma etching, the titanium nitride layer 1106 is etched with time control in such a way that the thickness of the dielectric layer 1104 remains substantially unchanged. The amount of material removed from the dielectric layer 1104 by the dry etch is less than 1 nm. An aim is to dry-etch the titanium nitride layer 1106 without overetching or with overetching of 0 s (seconds). This means that only material of the titanium nitride layer 1106 is to be removed, but no material is to be removed from the dielectric layer 1104. Therefore, when calculating the etching time the basis used has to be the thinnest locations of the titanium nitride layer 1106.

Figure 11C:
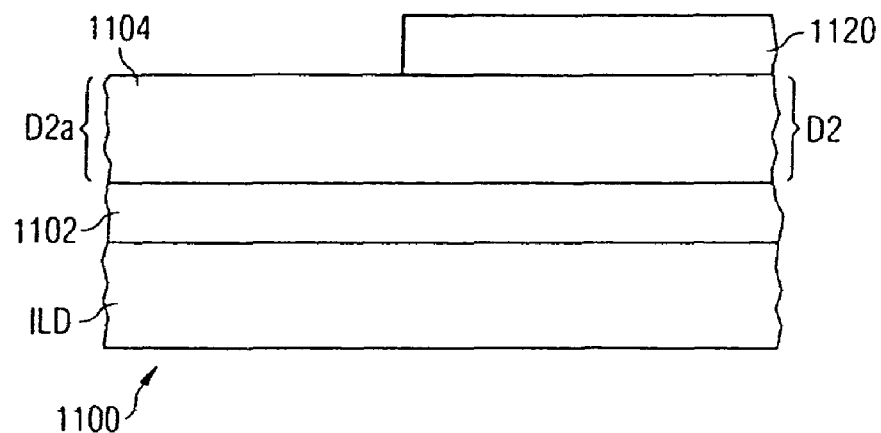
FIG. 11C shows the capacitor arrangement after a wet-chemical cleaning step for removal of residues of the electrode layer.

After the dry-etching process has been carried out, the remaining residues of the photoresist layer 1110 are removed again. In particular, the photoresist region 1112 is removed. Then, as illustrated in FIG. 11C, a wet cleaning step is carried out, in which the residues 1122 and 1124 are removed. The wet cleaning is highly selective with respect to the silicon nitride of the silicon nitride layer 1104, so that the thickness of the silicon nitride layer 1104 is reduced only slightly, to a thickness D2a.

The wet-chemical etching bath used is a mixture of a 35% strength aqueous hydrogen peroxide solution and an approximately 28% strength aqueous ammonia solution. The volumetric ratio of hydrogen peroxide solution to ammonia solution is 20:1. The wet-chemical etch is carried out at room temperature.

A titanium nitride etch may be highly selective with respect to the silicon nitride. During the wet-chemical leaning, the edge of the electrode 1120 is etched slightly, but this is not disruptive if the electrode 1120 has previously been patterned to be slightly larger than is actually necessary.

Figure 11D:
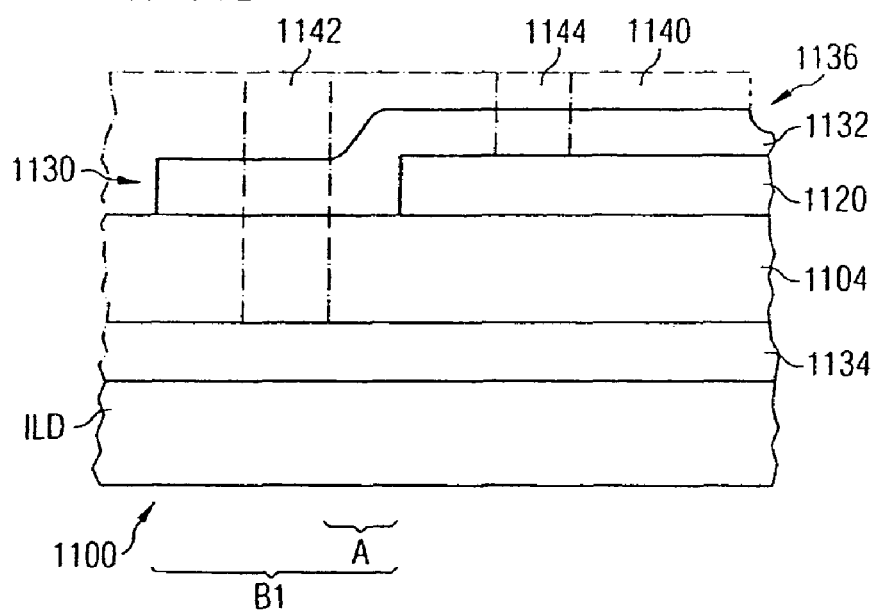
FIG. 11D shows further fabrication stages of the capacitor arrangement.

Then, as illustrated in FIG. 11D, a photoresist layer 1130 is deposited, exposed in accordance with a predetermined mask and developed, with a photoresist region 1132 being formed above a partial region B1 of a region of the silicon nitride layer 1104 which is not covered by the covering electrode 1120, and above the covering electrode 1120. In a subsequent dry-etching process, the silicon nitride layer 1104 and the titanium nitride layer 1102 below it are patterned in accordance with the photoresist region 1132, resulting in the formation of a bottom electrode 1134, which, together with the remaining dielectric of the dielectric layer 1104 and the covering electrode 1120, forms a capacitor arrangement 1136. At the same time, interconnects, which are used to connect the active components, are produced in the titanium nitride layer 1102.

After the residues of the photoresist layer 1130 have been removed, a dielectric layer 1140, which includes, for example, silicon dioxide and has a thickness of a few hundred nanometers, is applied to the capacitor arrangement 1136. The dielectric layer 1140 is planarized and forms the dielectric for the next metallization layer up, i.e. a metallization layer which is further away from the semiconductor substrate than the metallization layer produced from the titanium nitride layer 1102.

Then, contact section holes 1142 and 1144 for contact sections, i.e. for vias, are produced with the aid of a further lithography method. In the case of the contact section hole 1142, etching is carried out through the dielectric layers 1140 and 1104 to the bottom electrode 1134, whereas in the case of contact hole 1144 etching is carried out only through the dielectric layer 1140 to the covering electrode 1120.

The contact section holes 1142 and 1144 are then filled with an electrically conductive material, for example with tungsten, if appropriate with suitable intermediate layers being introduced. The right hand edge of the contact hole 1142 is at a distance A from the left-hand edge of the covering electrode 1120 of, for example, 400 nm.

In other exemplary embodiments, dielectric double layers or multiple layers are used instead of the dielectric layer 1104. Double or multiple layers of electrically conductive materials are likewise used instead of the titanium nitride layers 1102 and 1106. The methods which have been explained at the boundary between the upper layer stack comprising electrically conductive layers and a layer stack comprising dielectric layers, however, remain the same as described above with reference to FIGS. 11A to 11D.

In another exemplary embodiment, a contact section does not penetrate all the way through the dielectric layer 1104, for example if the bottom electrode is located in a metallization layer and is connected from below. Nevertheless, the dielectric of the capacitor and the bottom electrode project beyond the covering electrode in order to prevent damage to the dielectric during the patterning of the dielectric layer and of the bottom electrode in sensitive edge regions of the covering electrode. The projecting dielectric is not significantly etched by the procedure explained above, and residues of the layer used to produce the covering electrode also do not remain on the dielectric. In particular, there are no residues at the edge of the electrode in regions where the covering electrode has been patterned by the dry-etching method.

In other exemplary embodiments, contact is only made with the lower electrode on one lateral side of the capacitor. A via penetrates through the dielectric on the side with which contact is made. On the other side, the dielectric and the bottom electrode project beyond the covering electrode without a via being arranged there. As a result, damage to the dielectric at the sensitive electrode edge region is avoided on this side too.

The methods which have been explained with reference to FIGS. 11A to 11D are also used for capacitors which include a plurality of dielectric layers between three or more than three electrodes, in particular for capacitor arrangements which are located between two metallization layers or extend over a plurality of metallization layers.

The considerations which apply to one aspect of the invention are also valid for in each case the other aspects. Also, the measures described in the exemplary embodiments can be applied across the various aspects. It is therefore intended that the foregoing detailed description be regarded as illustrative rather than limiting, and that it be understood that it is the following claims, including all equivalents, that are intended to define the spirit and scope of this invention.

What is claimed is:

1. A method for fabricating an integrated capacitor arrangement, the method comprising:
    producing a layer stack including, in order, a base electrode layer, a base dielectric layer, at least one center electrode layer, a covering dielectric layer, and a covering electrode layer;
    producing a first photoresist layer on the layer stack;
    patterning the covering electrode layer and the center electrode layer using a first lithography; and
    producing a second photoresist layer on the base dielectric layer;
    patterning simultaneously the patterned covering electrode layer and the base electrode layer using a second lithography with the second photoresist layer on the base dielectric layer, wherein the center electrode layer is not patterned during the simultaneous patterning of the covering electrode layer and the base electrode layer using the second lithography.

2. The method of claim 1, further comprising producing a layer stack having at least two center electrode layers between the base electrode layer and the covering electrode layer, a center dielectric layer, being located between two adjacent center electrode layers and being produced after producing a center electrode layer and before producing the adjacent center electrode layer.

3. The method of claim 1, further comprising:
    patterning with the covering electrode layer, at least one electrode layer arranged between the covering electrode layer and the center electrode layer during the first lithography;
    patterning with the center electrode layer, at least another one electrode layer arranged between the center electrode layer and the base electrode layer during the first lithography;
    patterning the covering electrode layer and the at least one electrode layer arranged between the covering electrode layer and the center electrode layer during the second lithography; and
    patterning the base electrode layer and the at least another one electrode layer arranged between the base electrode layer and the center electrode layer during the second lithography.

4. The method of claim 3, further comprising patterning a first electrode layer and a second electrode layer during a third lithography without patterning a third electrode layer located the first and second electrode layers that are patterned in the third lithography.

5. The method of claim 1, further comprising etching on at least one dielectric layer when the first lithography is being carried out, with the dielectric layer being located beneath an electrode layer which is etched last in the first lithography, and with an end point detection being carried out to detect the end point of the etch, in particular an end point detection which is based on the evaluation of at least one spectral line.

6. The method of claim 5, where the end point detection comprises an evaluation of at least one spectral line.

7. The method of claim 1, further comprising, during at least one of the first and second lithographies, etching by chemical or chemical physical process at least one electrode being etched last, and etching a remaining part of the etched electrode by wet chemical means.

8. The method of claim 1, further comprising:
covering at least one partially etched region of a dielectric layer in the vicinity of the electrode layer which was patterned last in the first lithography with a resist in at least one subsequent lithography method; and
removing in a subsequent lithography method electrode layer edge regions that are patterned in the first lithography, in the vicinity of a dielectric layer which was etched through in the first lithography.

9. The method of claim 1, where the patterned layer stack is configured to be free of electrodes being flush in the stacking direction.

10. The method of claim 1, where electrode connections of every other electrode are arranged on alternate sides of the stack.

11. The method of claim 1, where the electrode layers have substantially the same thickness.

12. The method of claim 1, where a first electrode layer that is patterned prior to a second electrode layer have a greater thickness than the second electrode layer, the first electrode layer preferably being the covering electrode layer.

13. The method of claim 12, where the first electrode layer is the covering electrode layer.

14. The method of claim 1, where connections for one electrode are aligned along at least one side of an electrode.

15. The method of claim 1, where connections for an electrode are aligned along at least four sides of an electrode.

16. The method of claim 1, further comprising patterning an electrode layer to form a plurality of partial electrodes, where the partial electrodes are configured to be connected in order to increase the capacitance of the capacitor arrangement and at least one electrode layer is designed to be thinner than 100 nm.

17. The method of claim 16, where at least one electrode layer is designed to be thinner than more than half the electrode layers.

18. The method of claim 1, where at least one electrode layer has a thickness less than 100 nm.

19. The method of claim 1, where at least one electrode layer has a thickness less than all the electrode layers.

20. The method of claim 1, where at least one electrode layer has a thickness less than more than half the electrode layers.

* * * * *